(12) United States Patent
Abe et al.

(10) Patent No.: US 6,288,444 B1
(45) Date of Patent: Sep. 11, 2001

(54) SEMICONDUCTOR DEVICE AND METHOD OF PRODUCING THE SAME

(75) Inventors: Mitsuo Abe; Yoshihiro Kubota; Yoshitsugu Katoh; Michio Hayakawa; Ryuji Nomoto; Mitsutaka Sato; Seiichi Orimo; Hiroshi Inoue; Toshio Hamano, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/325,747

(22) Filed: Jun. 4, 1999

(30) Foreign Application Priority Data

Nov. 17, 1998 (JP) .................................................. 10-327193

(51) Int. Cl.$^7$ ..................................................... H01L 23/34
(52) U.S. Cl. .......................... 257/712; 257/675; 257/713; 257/717
(58) Field of Search .................................... 257/667, 675, 257/683, 712, 713, 717, 718, 719, 720

(56) References Cited

U.S. PATENT DOCUMENTS

| 5,102,829 | * | 4/1992 | Cohn ..................................... 257/713 |
| 5,345,106 | * | 9/1994 | Doering et al. ....................... 257/675 |
| 5,442,234 | * | 8/1995 | Liang ..................................... 257/675 |
| 5,583,377 | * | 12/1996 | Higgins, III .......................... 257/712 |
| 5,659,200 | * | 8/1997 | Sono et al. ............................. 257/713 |
| 5,691,567 | * | 11/1997 | Lo et al. ................................. 257/675 |
| 5,703,398 | * | 12/1997 | Sono et al. ............................. 257/675 |
| 5,783,426 | * | 7/1998 | Suzuki et al. ......................... 257/683 |
| 5,869,889 | * | 2/1999 | Chia et al. ............................. 257/713 |
| 5,972,736 | * | 10/1999 | Malladi et al. ....................... 257/675 |

FOREIGN PATENT DOCUMENTS

| 8-125051 | 5/1996 | (JP) . |
| 8-250529 | 9/1996 | (JP) . |
| 84110800 | 11/1997 | (TW) . |

* cited by examiner

*Primary Examiner*—Kevin M. Picardat
(74) *Attorney, Agent, or Firm*—Armstrong, Westerman, Hattori, Mcleland & Naughton, LLP

(57) ABSTRACT

A semiconductor device and a method of producing the semiconductor device are provided. This semiconductor device includes a semiconductor chip, a printed wiring board, a heat spreader, a sealing resin, and solder balls. The printed wiring board is provided with the solder balls on an outer portion and a wiring layer on an inner portion. Wires are bonded to the wiring layer, and an opening is formed in the center of the printed wiring board. The heat spreader is bonded to the printed wiring board, with the semiconductor chip being thermally connected to the stage portion of the heat spreader. The sealing resin is made up of a first sealing resin portion and a second sealing resin portion. The first and second sealing resin portions sandwich the heat spreader.

24 Claims, 30 Drawing Sheets

SEMICONDUCTOR DEVICE AND METHOD OF PRODUCING THE SAME

BACKGROUND OF THE INVENTION

1. Field of the Invention

The present invention generally relates to a semiconductor device and a method of producing the semiconductor device. More particularly, the present invention relates to a semiconductor device suitable for mounting a semiconductor chip which generates heat during an operation and to a method producing such a semiconductor device.

2. Description of the Related Art

As the density of a semiconductor chip has increased in recent years, the number of terminals in a semiconductor chip has increased accordingly. Also, there is a growing tendency for a semiconductor chip to consume a large amount of electric power and to generate a large amount of heat.

In the meantime, electric devices mounted with semiconductor chips have rapidly become smaller, and there is a demand for smaller semiconductor chips. Therefore, it is necessary to develop a semiconductor chip which is small and thin, even if the number of terminals is large.

FIG. 1 illustrates a conventional fine-pitch type semiconductor device 1. This semiconductor device 1 has a package structure called FBGA (Fine-pitch Ball Grid Array). This structure includes a semiconductor chip 2, a wiring board 3, solder balls 7, and a sealing resin 8.

The semiconductor chip 2 has a high density, and is fixed with an adhesive 5 onto the upper surface of the wiring board 3, which functions as an interposer. The wiring board 3 is a printed wiring board or a flexible printed board (in FIG. 1, a flexible printed board is shown). The wiring board 3 has a wiring layer 4 formed on a polyimide tape. The wiring layer 4 and the semiconductor chip 2 are electrically connected by a wire 6.

An opening is formed in a predetermined position of the polyimide tape, and the solder balls 7 are bonded to the wiring layer 4 through the opening. Thus, the semiconductor chip 2 is electrically connected to the solder balls 7 as external connecting terminals via the wiring layer 4.

The sealing resin 8 is molded to cover the semiconductor chip mounting surface of the wiring board 3, so as to protect the semiconductor chip 2, the wiring layer 4, and the wire 6.

In the semiconductor device 1 shown in FIG. 1, a fine pitch is obtained by arranging the solder balls 7 in a grid pattern on the wiring board 3, so that the semiconductor device 1 is compatible with the large number of terminals.

As a semiconductor chip has a higher density, the semiconductor chip generates a larger amount of heat. In the semiconductor device 1, the only heat releasing passage for the heat generated from the semiconductor chip 2 is the sealing resin 8 or the wiring board 3. However, the resin material used for the sealing resin 8 and the wiring board 3 is poor in thermal conductivity. The heat releasing efficiency of the semiconductor device 1 is low, and the heat generated from the semiconductor chip 2 stays inside the device. As a result, the semiconductor chip 2 is overheated, and causes a faulty operation.

SUMMARY OF THE INVENTION

The principal object of the present invention is to provide a semiconductor device and a method of producing the semiconductor device, which semiconductor device is smaller than a conventional semiconductor device while maintaining high heat spreading properties.

The object of the present invention is achieved by a semiconductor device including a semiconductor chip, a heat spreading plate, a wiring board, and a sealing resin. The semiconductor chip is mounted on the heat spreading plate having a stage portion. The sealing resin seals the semiconductor chip and the heat spreading plate so that the stage portion is exposed from the sealing resin.

In this structure, heat generated from the semiconductor chip can be efficiently released through the stage portion to the outside, so that the semiconductor chip can be efficiently cooled to avoid faulty operations.

The object of the present invention is also achieved by a method of producing a semiconductor device which includes the following steps of: forming a wiring board having a first wiring layer and an opening portion; forming a heat spreading plate having a fixed portion and a stage portion; temporarily fixing the heat spreading plate to the wiring board so that the stage portion facing the opening portion; mounting a semiconductor chip onto the stage portion; forming a sealing resin for permanently fixing the heat spreading plate to the wiring board so that the stage portion is exposed from the sealing resin; and cutting collectively the heat spreading plate, the wiring board, and the sealing resin, to form individual semiconductor devices.

By this method, the heat spreading plate formed in the heat spreading plate forming step is temporarily fixed to the wiring board formed in the wiring board forming step, so that the heat spreading plate and the wiring board can be collectively assembled. In this manner, the workability is improved compared with a method in which the heat spreading plate and the wiring board are handled and assembled separately.

The above and other objects and features of the present invention will become more apparent from the following description taken in conjunction with the accompanying drawings.

DESCRIPTION OF THE PREFERRED EMBODIMENTS

The following is a description of the embodiments of the present invention, with reference to the accompanying drawings.

Figure 2:
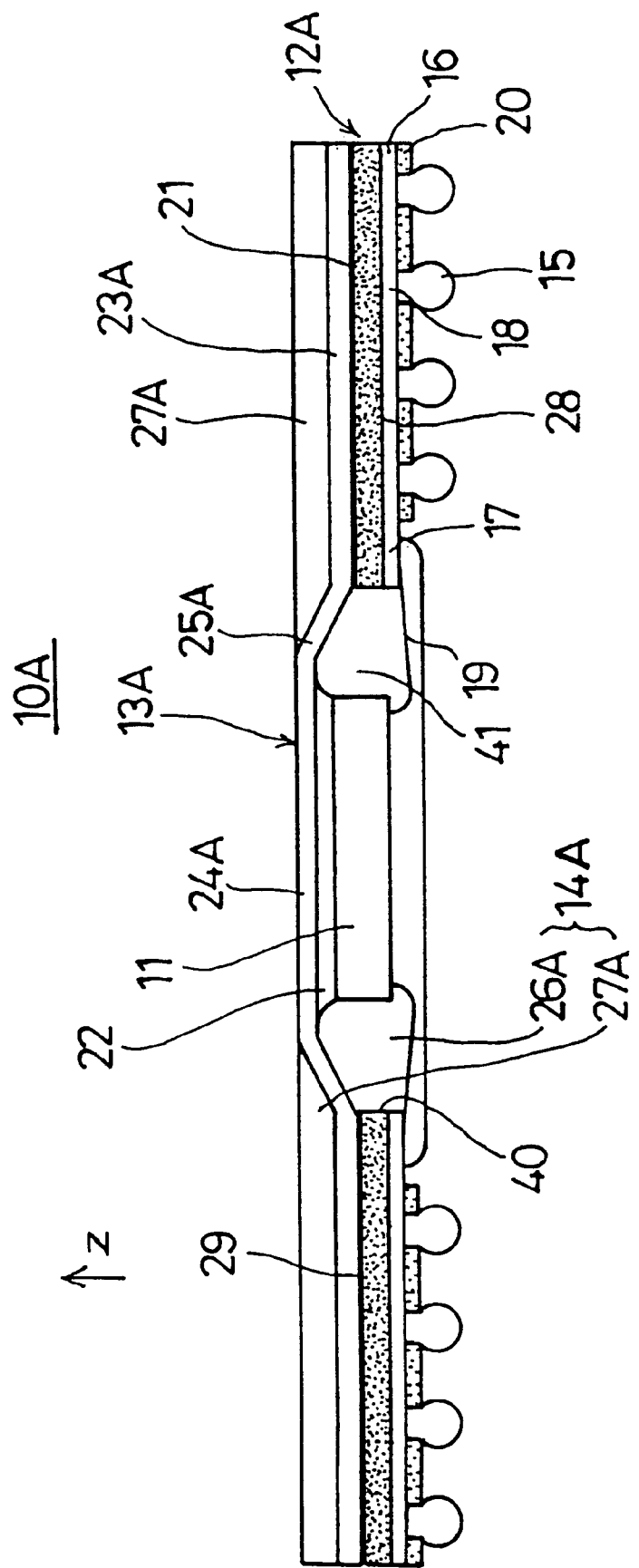
FIG. 2 illustrates a first embodiment of a semiconductor device of the present invention.

FIG. 2 shows a semiconductor device 10A of a first embodiment of the present invention. The semiconductor device 10A comprises a semiconductor chip 11, a printed wiring board 12A, a heat spreader 13A, a sealing resin 14A, and solder balls 15.

The semiconductor chip 11 is a high density and high power dissipation device. When operated, the semiconductor chip 11 generates a large amount of heat.

In this embodiment, the printed wiring board 12A is used as a wiring board. The printed wiring board 12A is a glass-epoxy resin substrate, and a wiring layer 16 is formed on the side of the wiring board 12A provided with the solder balls 15 (hereinafter referred to as a packaging side surface 28). The wiring layer 16 is made of copper (Cu), for instance, and its surface is protected by a resist 20.

The solder balls 15, which serve as external connecting terminals, are connected to the outer portion of the wiring layer 16 via holes 42 (shown in FIG. 10) formed through the resist 20. Bonding pads 17, to which wires 19 to be electrically connected to the semiconductor chip 11 are bonded, are formed on the inner portion of the wiring layer 16.

A rectangular opening 40 is formed in the center of the printed wiring board 12A. The size of the opening 40 seen on a plane is larger than the size of the semiconductor chip 11 seen on a plane, so that the semiconductor chip 11 can be attached within the opening 40.

The heat spreader 13A functions as a heat radiating plate, and therefore is made of a metallic material having excellent thermal conductivity, such as copper (Cu) or aluminum (Al). The heat spreader 13A is integrally made up of a fixed portion 23A, a stage portion 24A, and connecting portions 25A.

Figure 4:
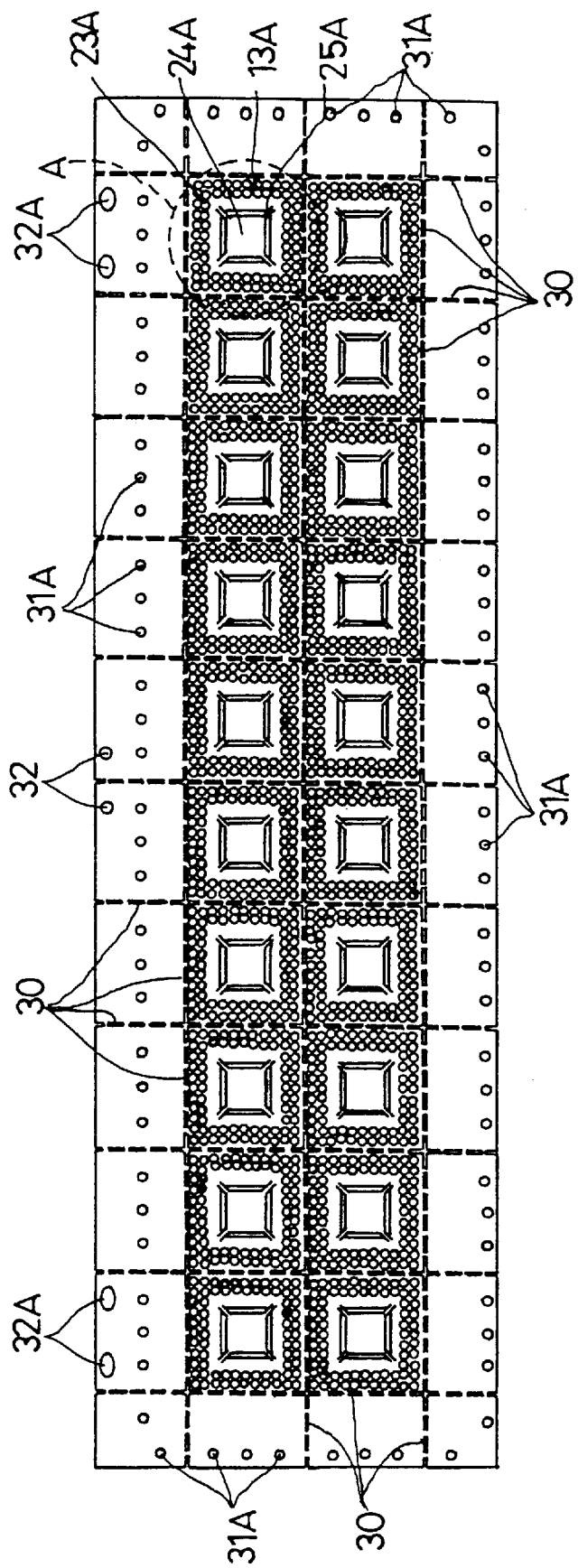
FIG. 4 illustrates the semiconductor device of the first embodiment in a heat spreader forming step.
Figure 5:
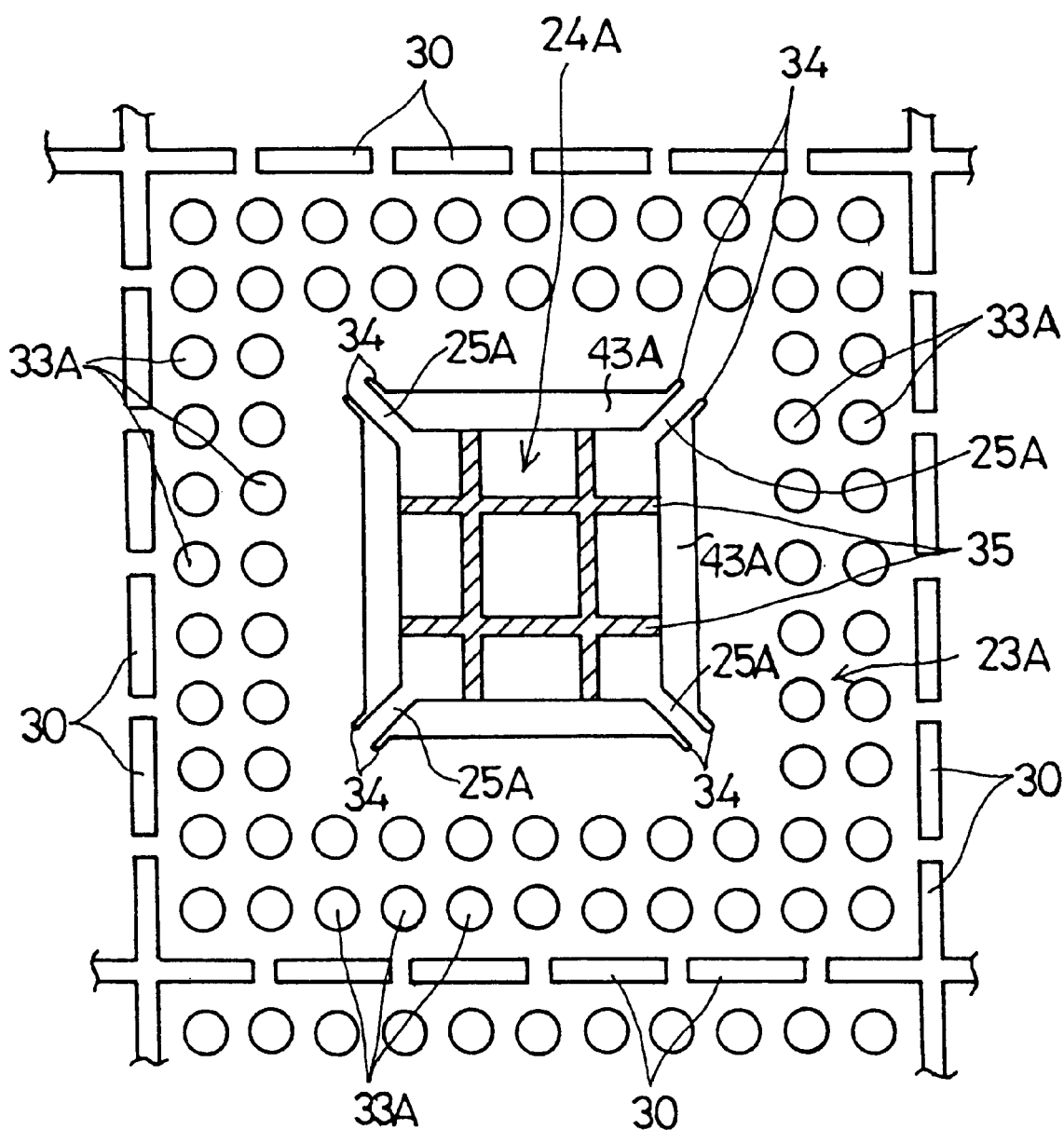
FIG. 5 illustrates the semiconductor device of the first embodiment in the heat spreader forming step.

FIG. 5 is a plan view of the heat spreader 13A. For ease of explanation, the heat spreader 13A shown in FIG. 5 is not yet integrated into the semiconductor device 10A (FIG. 5 is an enlarged view of the region circled by a broken line A in FIG. 4).

The fixed portion 23A is fixed onto the upper surface 29 of the printed wiring board 12A. The upper surface 29 is the opposite surface to the packaging side surface 28, and provided with a plurality of anchor holes 33A. In this embodiment, the fixed portion 23A extends to the outer periphery of the printed wiring board 12A, and the peripheral portion is exposed to the outside.

A first adhesive 21 for temporarily fixing the heat spreader 13A to the printed wiring board 12A in a heat spreader temporary fixing process (shown in FIG. 3) is disposed between the fixed portion 23A and the printed wiring board 12A.

The stage portion 24A faces the opening 40 formed in the printed wiring board 12A, and is caved in the direction of an arrow Z shown in FIG. 2 with respect to the fixed portion 23A. The semiconductor chip 11 is mounted onto the stage portion 24A. and a concave portion 35 is formed in the position where the semiconductor chip 11 is to be disposed, as indicated by the shaded portion in FIG. 5.

A second adhesive 22 is used in bonding the semiconductor chip 11 to the stage portion 24A. The second adhesive 22 contains metallic powder so as to have high thermal conductivity. The stage portion 24A and the semiconductor chip 11 are thermally bonded with the second adhesive 22. Other types of adhesive can be used as the second adhesive 22, as long as they have high thermal conductivity.

With the concave portion 35, the semiconductor chip mounting surface of the stage portion 24A is not flat. When bonding the semiconductor chip 11 to the stage portion 24A, the second adhesive 22 fills in the uneven portions, so that a larger amount of adhesive assures the sealing between the stage portion 24A and the semiconductor chip 11.

Although the concave portion 35 has a grid pattern, the design of the concave portion 35 is not limited to this. As long as the sealing between the stage portion 24A and the semiconductor chip 11 is surely maintained, the concave portion 35 can have other shapes, such as circles or triangles.

The connecting portions 25A connect the fixed portion 23A and the stage portion 24A, and are situated between the fixed portion 23A and the four corners of the stage portion 24A. As shown in FIG. 2, the connecting portions 25A, the fixed portion 23A, and the stage portion 24A are at angles so that the stage portion 24A is caved in the direction of the arrow Z with respect to the fixed portion 23A. Furthermore, the inner rims of the fixed portion 23A conform to the rim of the opening 40. Because of this, the connecting portions 25A extend from the rim of the opening 40 formed in the printed wiring board 12A.

By caving the stage portion 24A in the direction of the arrow Z with respect to the fixed portion 23A and forming the opening 40 in a position facing the stage portion 24A of the printed wiring board 12A. a space (a cavity portion 41) is formed in the center of the semiconductor device 10A. The semiconductor chip 11 is disposed in the cavity portion 41.

The sealing resin 14A is made up of a first sealing resin portion 26A and a second sealing resin portion 27A. The first sealing resin portion 26A and the second sealing resin portion 27A are integrally formed via resin filling openings 43A (shown in FIG. 5) formed on the sides of the connecting portions 25.

The first sealing resin portion 26A is formed on the bonding side of the semiconductor chip 11 of the heat spreader 13A to protect the semiconductor chip 11 and the wires 19. The second sealing resin portion 27A is formed on the opposite surface to the bonding side of the semiconductor chip 11, and the stage portion 24A is exposed from the second sealing resin portion 27A. The second sealing resin portion 27A bonds the heat spreader 13A to the printed wiring board 12A.

In this embodiment, the solder balls 15 are used as the external connecting terminals, and are electrically connected to the wiring layer 16 via the holes 42 formed through the resist 20. The solder balls 15 can be formed on the entire surface of the packaging side surface 28 of the printed wiring board 12A (except the position of the opening 40), and can have grid patterns. Because of this, a large number of solder balls 15 can be arranged on the printed wiring board 12A while maintaining relatively wide intervals between the balls. Thus, the semiconductor chip 11 has high density, and is compatible with a large number of terminals.

In the semiconductor device 10A having the above structure, the semiconductor chip 11 is thermally bonded to the heat spreader 13A, and the stage portion 24A of the heat spreader 13A, to which stage portion 24A the semiconductor chip 11 is bonded, is exposed from the sealing resin (the second sealing resin portion 27A). With this structure, heat generated from the semiconductor chip 11 is efficiently released from the stage portion 24A to the outside.

In this embodiment, the fixed portion 23A is exposed to the outside from the second sealing resin portion 27A so as to release the heat from this end also. By doing so, the semiconductor chip 11 can be efficiently cooled down so as to surely avoid faulty operation of the semiconductor chip 11.

With the stage portion 24A being caved in the direction of the arrow Z with respect to the fixed portion 23A and the opening 40 being formed through the printed wiring board 12A, the cavity portion 41 is formed in the position of the semiconductor chip 11. With the semiconductor chip 11 being placed on the heat spreader 13A, a part of the semiconductor chip 11 is situated inside the printed wiring board 12A.

Figure 1:
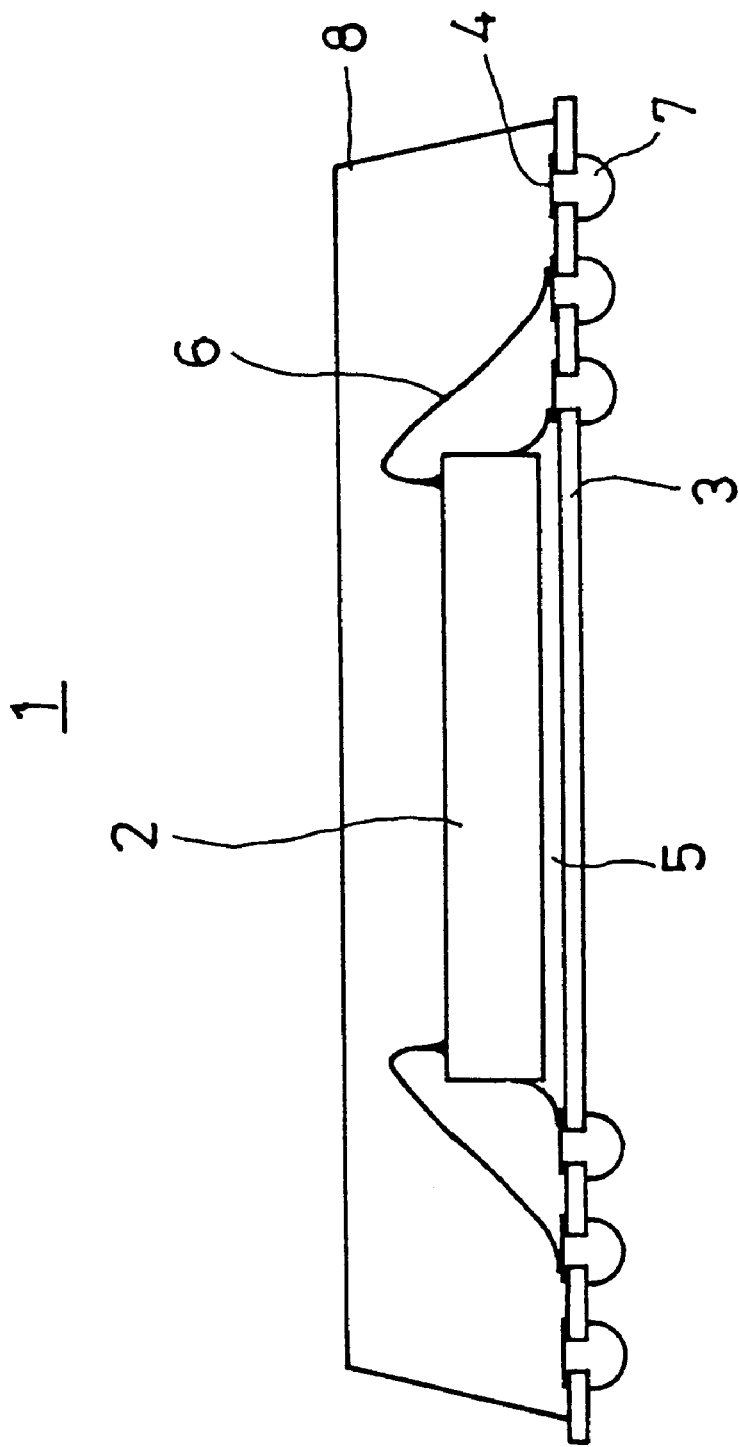
FIG. 1 illustrates one example of a conventional semiconductor device.

More specifically, in this embodiment, the circuit formation surface (the surface to which the wires 19 are bonded) of the semiconductor chip 11 becomes level with the packaging side surface 28 of the printed wiring board 12A or slightly caved from the packaging side surface 28. Thus, the semiconductor device 10A can be thinner than the conventional semiconductor device 1 shown in FIG. 1 having the semiconductor chip 2 on the circuit board 3.

The sealing resin 14A is made up of the first and second sealing resin portions 26A and 27A, which sandwich the heat spreader 13A. As a result, when subjected to heat, the first and second sealing resin portions 26A and 27A are heat-deformed in the same manner. Thus, the heat spreader 13A (the semiconductor device 10A) can be well prevented from being deformed, compared with a structure having the sealing resin 14A only on one surface of the heat spreader 13A.

As described above, the inner rim of the fixed portion 23A conforms to the rim of the opening 40, so that the connecting portions 25A extend outward from the rim of the opening formed through the printed wiring board 12A. The bonding pads 17, to which the wires 19 are bonded, are formed around the outer periphery of the opening 40 of the printed wiring board 12A. Accordingly, the fixed portion 23A of the heat spreader 13A is always situated on the side of the printed wiring board 12A reverse to the positions of the bonding pads 17.

The fixed portion 23A of the heat spreader 13A functions as a backing board at the time of wire bonding. The fixed portion 23A can accurately transmit ultrasonic vibration applied at the time of wire bonding to the wires 19 and the printed wiring board 12A, thereby maintaining good wire bonding workability.

As described above, the connecting portions 25A extend outward from the rim of the opening 40, so that the rim of the opening 40 does not face the connecting portions 25A and the stage portion 24A of the heat spreader 13A. In other words, the printed wiring board 12A does not face the connecting portions 25A and the stage portion 24A.

When wire-bonding the semiconductor chip 11 on the stage portion 24A, the printed wiring board 12A never hinders a capillary operation, thereby maintaining smooth wire bonding workability.

The following is a description of a method of producing the semiconductor device 10A of the first embodiment, with reference to FIGS. 3 to 13.

Figure 3:
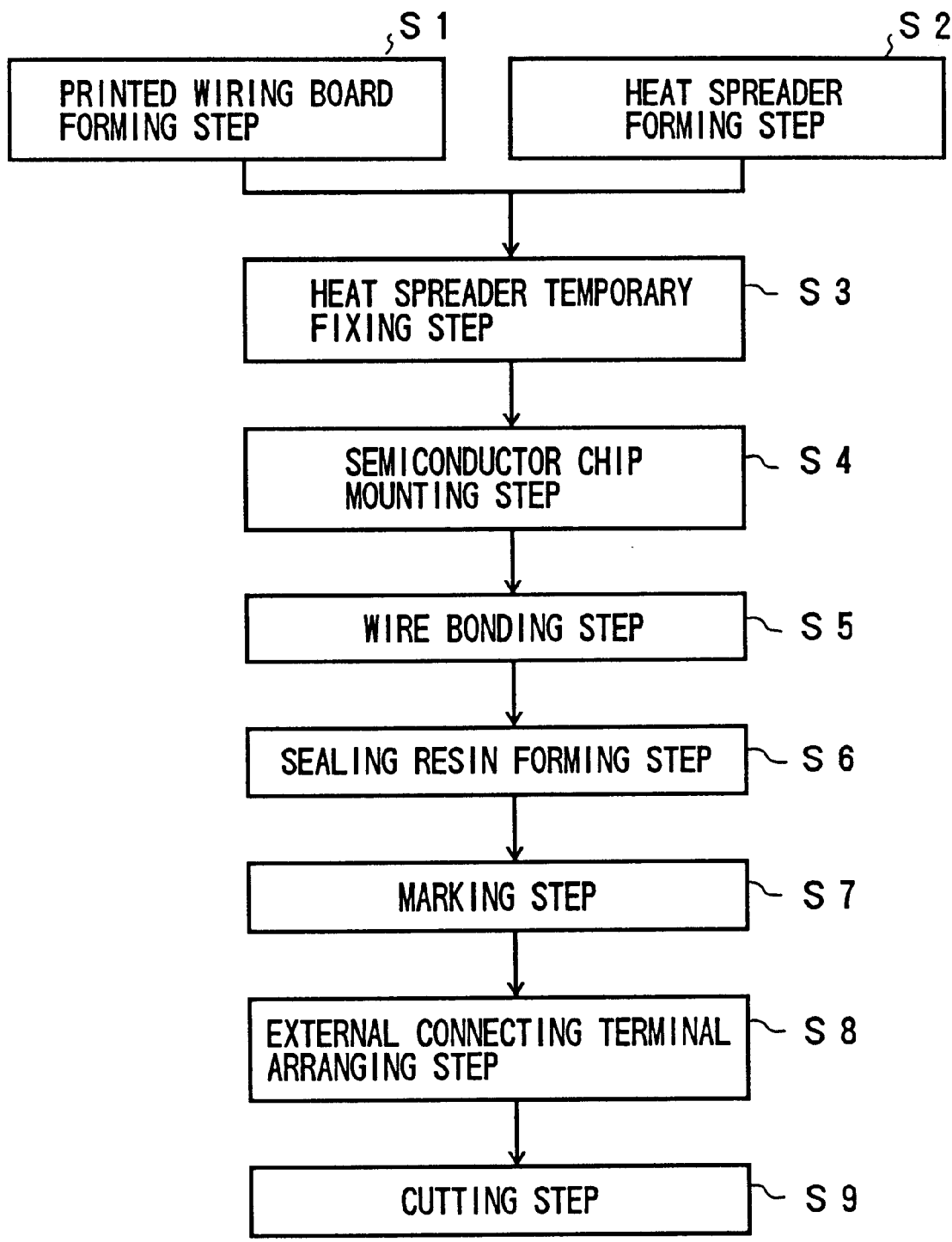
FIG. 3 is a flowchart of a method of producing the semiconductor device of the first embodiment.

FIG. 3 is a flowchart of the method of producing the semiconductor device 10A. As shown in FIG. 3, the method of producing the semiconductor device 10A comprises a printed wiring board forming step (step 1: "step" will be hereinafter referred to as "S"), a heat spreader forming step (S2), a heat spreader temporary fixing step (S3), a semiconductor chip mounting step (S4), a wire bonding step (S5), a sealing resin forming step (S6), a marking step (S7), an external connecting terminal arranging step (S8), and a cutting step (S9).

The printed wiring board forming step (S1) is a step of forming the printed wiring board 12A. In this step, the wiring layer 16 having Junction electrodes 18 (shown in FIG. 8) to which the solder balls 15 are attached are formed on a glass-epoxy resin basic material by a plating method and an etching method.

The opening 40, through which the semiconductor chip 11 is attached, is formed in the center of the wiring layer 16. The opening 40 is formed by stamping. The stamping can be carried out before or after the formation of the wiring layer 16.

In this embodiment, a so-called multi-cavity molding is performed to form a basic material into a plurality of printed wiring boards 12A. More specifically, twenty printed wiring boards 12A are formed from one basic material.

Figure 8:
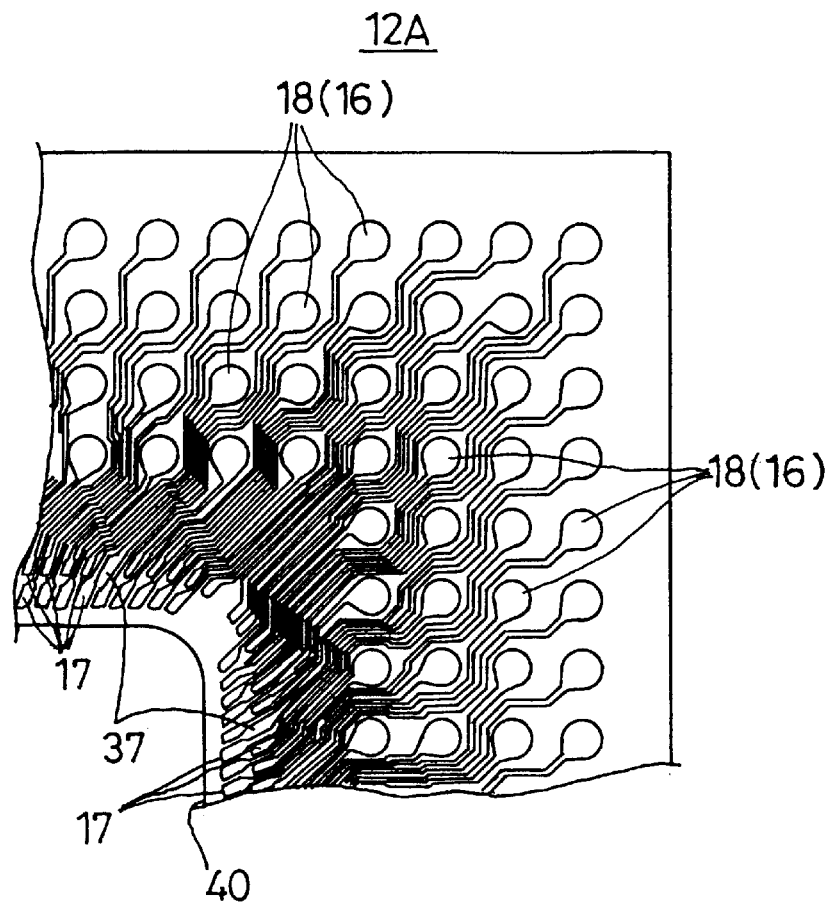
FIG. 8 illustrates the semiconductor device of the first embodiment in a printed wiring board forming step.

FIG. 8 is a partially enlarged view of one of the printed wiring boards 12A formed in the printed wiring board forming step (S1). As shown in FIG. 8, the bonding pads 17 are arranged in a grid pattern, and gap portions 37 are formed at intervals in the bonding pad formation area.

As described above, the larger the number of terminals of the semiconductor chip 11, the larger the number of bonding pads formed on the printed wiring board 12A. To make the semiconductor device 10A compact, the area in which the bonding pads 17 are formed needs to be small. In view of this, the bolding pads 17 are arranged in a grid pattern so as to make the bonding pad formation area small.

If the bonding pads 17 are arranged too close to each other, crossings might occur between adjacent wires 19 when the wires 19 are bonded to the bonding pads 17. To prevent this, the gap portions 37 are formed at intervals in the bonding pad formation area. The gap portions 37 reverse the wire bonding positions in the gap portions 37, thereby allowing more space of the wires 19. Thus, crossings of the wires 19 can be avoided.

The heat spreader forming step (S2) is a step of forming the heat spreader 13A. In this step, stamping is carried out on a basic material, such as a copper plate or an aluminum plate having good thermal conductivity, to form the heat spreader 31A.

FIG. 4 shows a heat spreader 13 formed in the heat spreader temporary fixing step. As shown in FIG. 4, multi-cavity molding is performed in this embodiment, and one heat spreader 13 includes twenty heat spreaders 13A.

In the following description, each thermal conducting plate disposed in the semiconductor device 10A is referred to as the heat spreader 13A, and thermal conducting plates connected to each other (as shown in FIG. 4) are referred to as the heat spreader 13.

As shown in FIG. 4, the twenty heat spreaders 13A are surrounded by outer periphery anchor holes 31A on the outer periphery of the heat spreader 13. Cutting slits are also formed in a grid pattern. Positioning holes 32A are also formed, and the stage portion 24A is formed in the center of each heat spreader 13A. The stage portion 24A is caved with respect to the fixed portion 23A.

The outer periphery anchor holes 31A improve the bond between the sealing resin 14A and the heat spreader 13 in the sealing resin forming step (S6). The cutting slits 30 are formed along the cutting positions of a blade used in cutting the semiconductor device 10A in the cutting step (S9).

Furthermore, the positioning holes 32A position the printed wiring board 12A with respect to the heat spreader 13, and metal molds 45 and 46 (shown in FIG. 11) with respect to the heat spreader 13, in the heat spreader temporary fixing step (S3) and the sealing resin forming step (S6).

The outer periphery anchor holes 31A are circular on a plan view, and the cutting slits 30 are narrow rectangular on a plan view in this embodiment. However, the outer periphery anchor holes 31A and the cutting slits 30 may have other shapes.

FIG. 5 shows one of the heat spreaders 13A in the heat spreader 13. Each heat spreader 13A comprises the fixed portion 23A, the stage portion 24A, connecting portions 25A, cutting slits 30, anchor holes 33A, slits 34, and resin filling openings 43A. The fixed portion 23A, the stage portion 24A, the connecting portions 25A, the cutting slits 30, and the resin filling openings 43A have already been explained in the foregoing description.

Each of the anchor holes 33A is circular on a plan view in this embodiment. Eighty of the anchor holes 33A are formed through the fixed portion 23A, surrounding the stage portion 24A. Each of the heat spreaders 13A is bonded to one printed wiring board 12A, and in the bonded condition, anchor grooves or anchor holes (not shown) of the printed wiring board 12A face the anchor holes 33A of he heat spreader 13A.

The slits 34 are formed in the bonding positions between the fixed portion 23A and the connecting portions 25A. Each slit 34 is U-shaped, and 0.15 mm in width and 0.5 mm in length. By forming the slits 34 in the bonding positions between the fixed portion 23A and the connecting portions 25A, unwanted deformation and distortion can be avoided when stamping the stage portion 24A with respect to the fixed portion 23A.

When stamping the stage portion 24A, stress is applied to the bonding positions between the fixed portion 23A and the connecting portions 25A, which are the folded portions. If a mechanism for releasing the stress is not employed, deformation and distortion are caused by the stress at the bonding positions.

In this embodiment, the slits 34 formed in the stress applied positions become deformed to absorb the applied stress. Thus, unwanted deformation or distortion is not caused to the fixed portion 23A, the stage portion 24A, and the connecting portions 25A. Although the slits 34 are formed at the bonding positions between the connecting portions 25A and the fixed portion 23A in this embodiment, the slits 34 may be formed at the bonding positions between the stage portion 24a and the connecting portions 25A.

Figure 6:
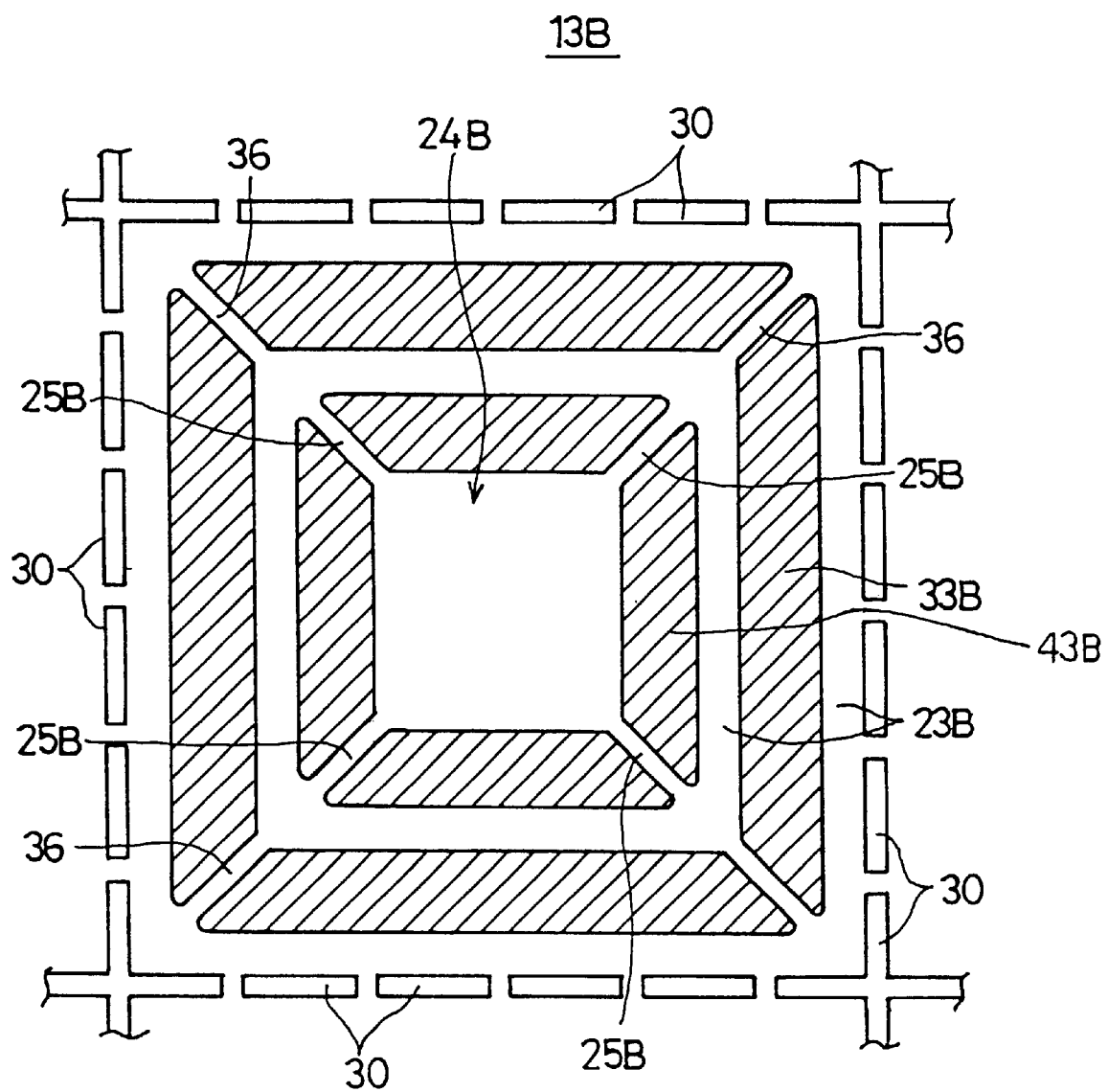
FIG. 6 illustrates the semiconductor device of the first embodiment in the heat spreader forming step.
Figure 7:
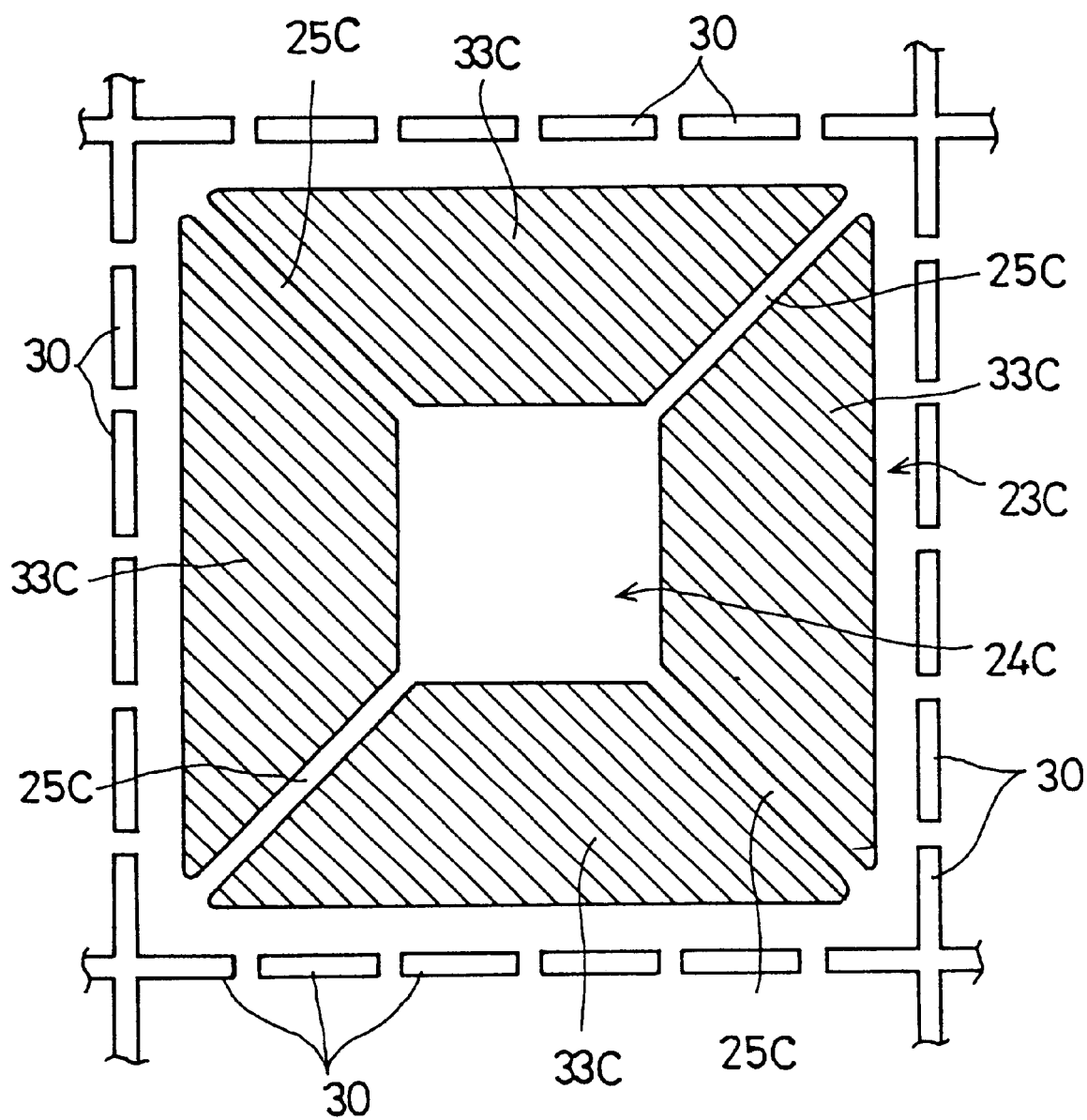
FIG. 7 illustrates the semiconductor device of the first embodiment in the heat spreader forming step.

FIGS. 6 and 7 illustrate heat spreaders 13B and 13C which are modifications of the heat spreader 13A shown in FIG. 5.

The heat spreader 13B of FIG. 6 is characterized by rectangular anchor holes 33B. The anchor holes 33A in the heat spreader 13A of FIG. 5 are circular, but the anchor holes 33A may have rectangular shapes as shown in FIG. 6 or other shapes.

The heat spreader 13C of FIG. 7 has connecting portions 25C which are smaller in area. By making the areas of the connecting portions 25C smaller, anchor holes 33C can also function as the resin filling openings. Accordingly, the anchor holes 33C can improve the bond with the printed wiring board 12A, and as the resin filling openings, the anchor holes 33C can improve the performance in filling the sealing resin 14A in the sealing resin forming step.

The printed wiring board forming step (S1) and the heat spreader forming step (S2) can be carried out at the same time as separate steps. The order of the two steps is not particularly fixed.

The printed wiring board forming step (S1) and the heat spreader forming step (S2) are followed by the heat spreader temporary fixing step (S3). In this step, the heat spreader 13 (13A) is temporarily fixed to the printed wiring board 12A.

More specifically, the stage portion 24A of the heat spreader 13A is positioned by the positioning openings 32 and others so as to face the opening 40 formed through the printed wiring board 12A. The heat spreader 13 (13A) is then temporarily fixed to the printed wiring board 12A. In this embodiment, the first adhesive 21 is used in temporarily fixing the heat spreader 13 (13A) to the printed wiring board 12A.

By carrying out the heat spreader temporary fixing step, the heat spreader 13 (13A) and the printed wiring board 12A can be handled as a unit, and the workability in assembling the semiconductor device 10A is improved.

Figure 9:
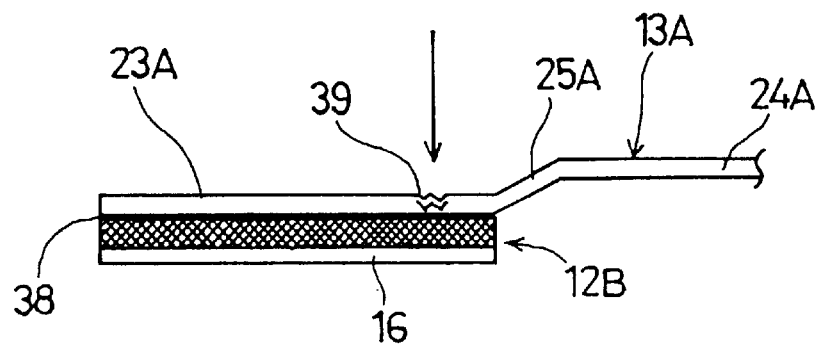
FIG. 9 illustrates the semiconductor device of the first embodiment in a heat spreader temporary fixing step.

The means for temporarily fixing the heat spreader is not limited to the adhesive 21. It is also possible to perform laser welding as shown in FIG. 9. When the heat spreader 13 (13A) is temporarily fixed to the printed wiring board 12A by laser welding, a dummy pattern should be formed in advance in a position where no bonding pads 17 of the printed wiring board 12A exist.

A laser welding device is used to weld the fixed portion 23A of the heat spreader 13 (13A) to the dummy pattern 38 on the printed wiring board 12A. Thus, the heat spreader 13 (13A) can be bonded to the printed wiring board 12A by laser welding.

In the above manner, bonding can be carried out in positions which require a particularly tight bond. Even if the wiring density on the printed wiring board 12A is high (in a case where wiring is carried out on the upper surface 29 of the printed wiring board 12A), the printed wiring board 12A and the heat spreader 13 (13A) can be tightly bonded.

Since the bond by welding in this embodiment is tighter than the bond by the adhesive 21, the heat spreader 13 (13A) and the printed wiring board 12A can be permanently bonded by welding. The welding means described above is not limited to laser welding, but other welding means (such as spot welding) can be used.

The heat spreader temporary fixing step (S3) is followed by the semiconductor chip mounting step (S4) and the wire bonding step (S5) in that order.

Figure 10:
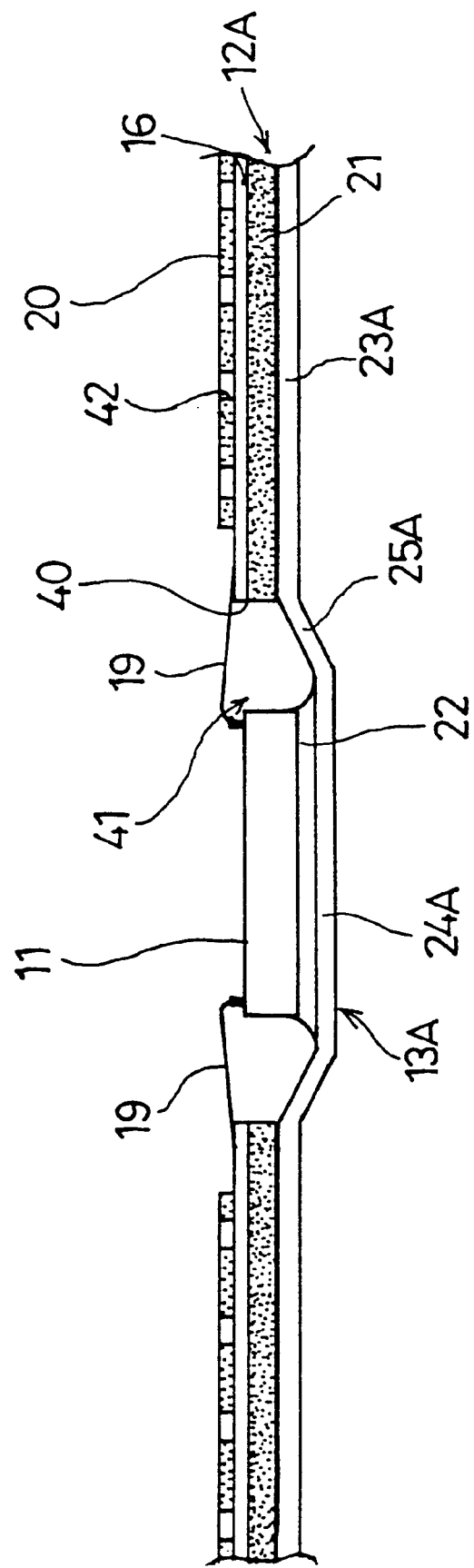
FIG. 10 illustrates the semiconductor device of the first embodiment in a semiconductor chip mounting step and a wire bonding step.

Since the rim of the opening 40 does not extend to the position facing the connecting portions 25A and the stage portion 24A of the heat spreader 13A, the semiconductor chip 11 can be smoothly attached to the stage portion 24A, and the wires 19 can be smoothly bonded in these two steps. FIG. 10 illustrates the conditions after the semiconductor chip mounting step (S4) and the wire bonding step (S5).

The semiconductor mounting step (S4) and the wire bonding step (S5) are followed by the sealing resin forming step (S6). In the sealing resin forming step, the sealing resin 14A (i.e., the first sealing resin portion 26A and the second sealing resin portion 27A) is formed. In this embodiment, the sealing resin 14A is formed by a transfer molding method, for instance.

Figures 11A, 11B:
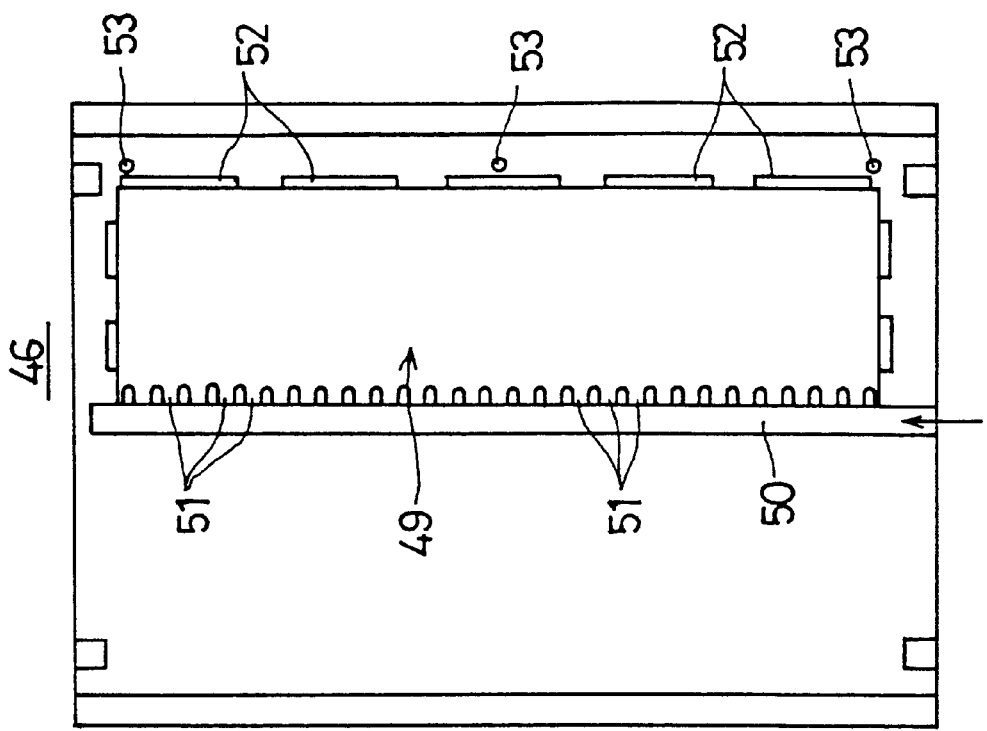
FIGS. 11A and 11B illustrate the semiconductor device of the first embodiment in a sealing resin forming step.

FIGS. 11A and 11B illustrate a metal mold for forming the sealing resin 14A. The heat spreader 13 having the semiconductor chip 11 and the printed wiring board 12A are inserted in the metal mold so as to form the sealing resin 14A. FIG. 11A illustrates an upper mold 45, and FIG. 11B illustrates a lower mold 46.

The upper mold 45 is provided with upper cavities 47 and positioning holes 48. The upper cavities 47 face the semiconductor chip 11 when the heat spreader 13 and the printed wiring board 12A are attached to the upper mold 45. The upper cavities 47 are mainly used for forming the first sealing resin portion 26A.

The lower mold 46 is provided with a lower cavity 49, a runner 50 for filling resin, gates 51, area vents 52, and positioning pins 53 for positioning the upper mold 45.

The lower cavity 49 is mainly used for forming the second sealing resin portion 27A, which is provided to the twenty heat spreaders 13A at once. The lower mold 46 has a number of gates 51 formed on the runner 50, so that resin filling can be smoothly carried out even if the lower cavity 49 is large in area (or volume).

The resin injected from an injection molding machine (not shown) is filled in the runner 50 in the direction indicated by the arrow in FIG. 11B, and the resin enters from the gates 50 into the lower cavity 49. Since each heat spreader 13A is provided with the resin filling openings 43A (shown in FIG. 5), the resin in the lower cavity 49 then enters the upper cavities 47 of the upper mold 45 through the resin filling openings 43A. Thus, the first and second sealing resin portions 26A and 27 are formed simultaneously in the sealing resin forming step.

The large-area second sealing portion 27A is collectively formed on the entire surface of the heat spreader 13 (except in the position of the stage portion 24A) in the sealing resin forming step, so that large-area molding can be carried out. Thus, the production efficiency is high, compared with the conventional structure in which the heat spreaders 13A and the printed wiring board 12A are divided in advance, and the sealing resin is formed individually. In this embodiment, the production costs can also be reduced.

In the printed wiring board step (S1) and the heat spreader forming step (S2), the heat spreaders 13A and the printed wiring board 12A are collectively formed. This also improves the production efficiency and reduces the production costs.

Figure 12:
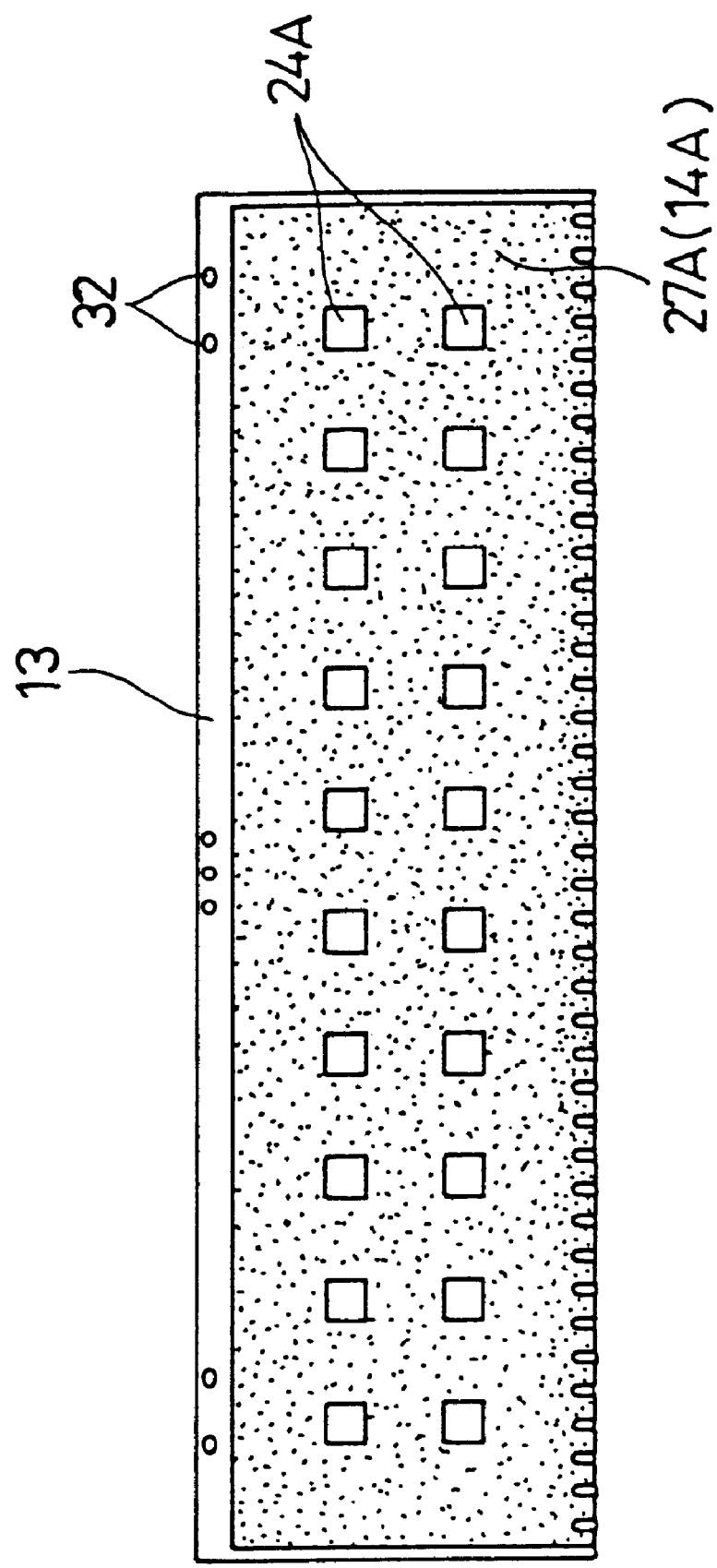
FIG. 12 illustrates the semiconductor device of the first embodiment in the sealing resin forming step.
Figure 13:
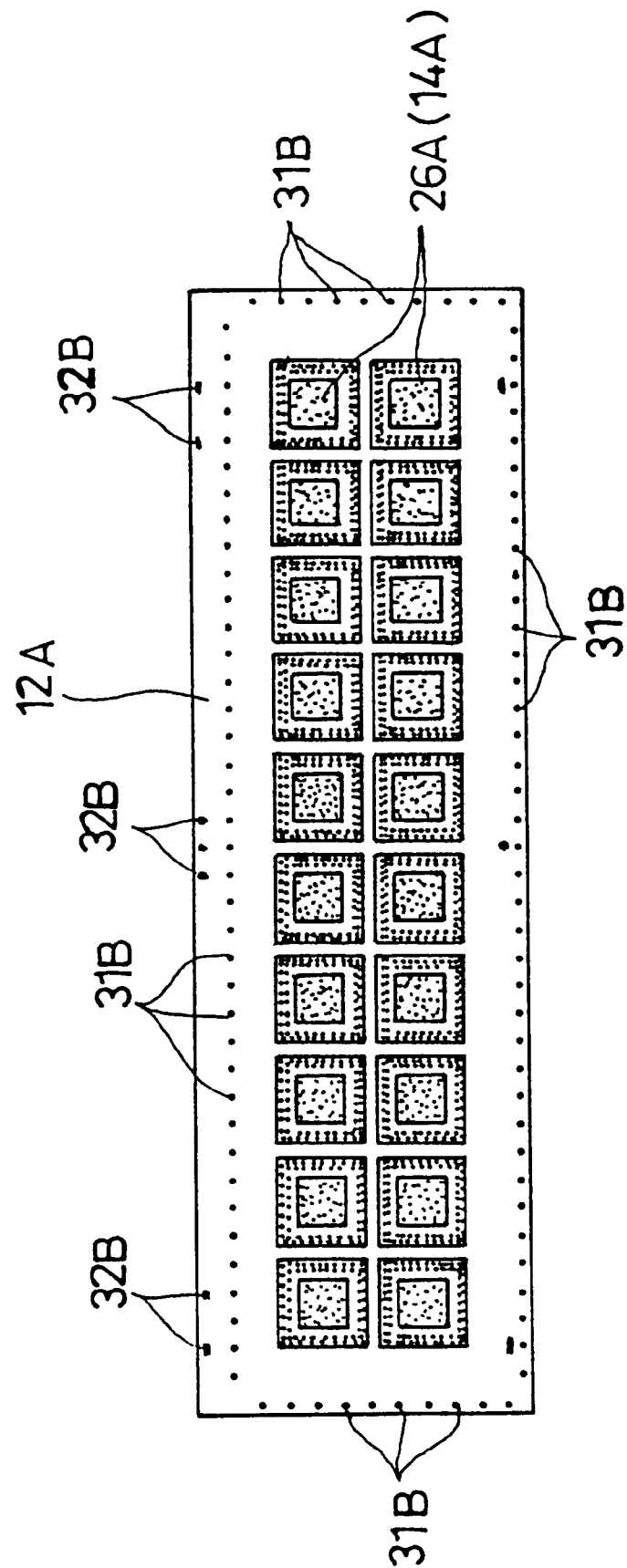
FIG. 13 illustrates the semiconductor device of the first embodiment in the sealing resin forming step.

FIGS. 12 and 13 illustrate the heat spreader 13 and the printed wiring board 12A after the sealing resin forming step. FIG. 12 is a view from the heat spreader 13 side, and FIG. 13 is a view from the printed wiring board 12A side.

With the sealing resin 14A, the second sealing resin portion 27A is filled in the anchor holes 33 formed in the fixed portion 34A of each heat spreader 13A, and in the anchor grooves (or the anchor holes) in the printed wiring board 12A. The anchor grooves face the anchor holes 33A.

The resin is also filled in the outer periphery anchor holes 31A (shown in FIG. 4) formed on the outer periphery of the heat spreader 13. The sealing resin 14A also functions as a fixing member for fixing the heat spreader 13 onto the printed wiring board 12A.

After the sealing resin forming step (S6), the heat spreader 13 and the printed wiring board 12A provided with the sealing resin 14A are separated from the metal mold (45 and 46). The marking step (S7) is then carried out for putting a mark for identifying the semiconductor device 10A in a predetermined position in the sealing resin 14A. The marking step is followed by the external connecting terminal arranging step (S8) carried out for arranging the solder balls 15. The solder balls 15 are arranged on the printed wiring board 12A by a transferring method, for instance.

The external connecting terminal arranging step (S8) is followed by the cutting step (S9). In this cutting step, the heat spreader 13, the printed wiring board 12A, and the sealing resin 14A are collectively cut with a blade at the outer periphery of a corresponding semiconductor device 10A. Thus, the semiconductor device 10A shown in FIG. 2 can be obtained.

The heat spreader 13 is provided with the cutting slits 30 formed along the cutting line of the blade. The cutting slits 30 are formed even on the outer periphery of the heat spreader 13. In this manner, a load applied to the blade is reduced, and the life of the blade is prolonged.

Figure 14:
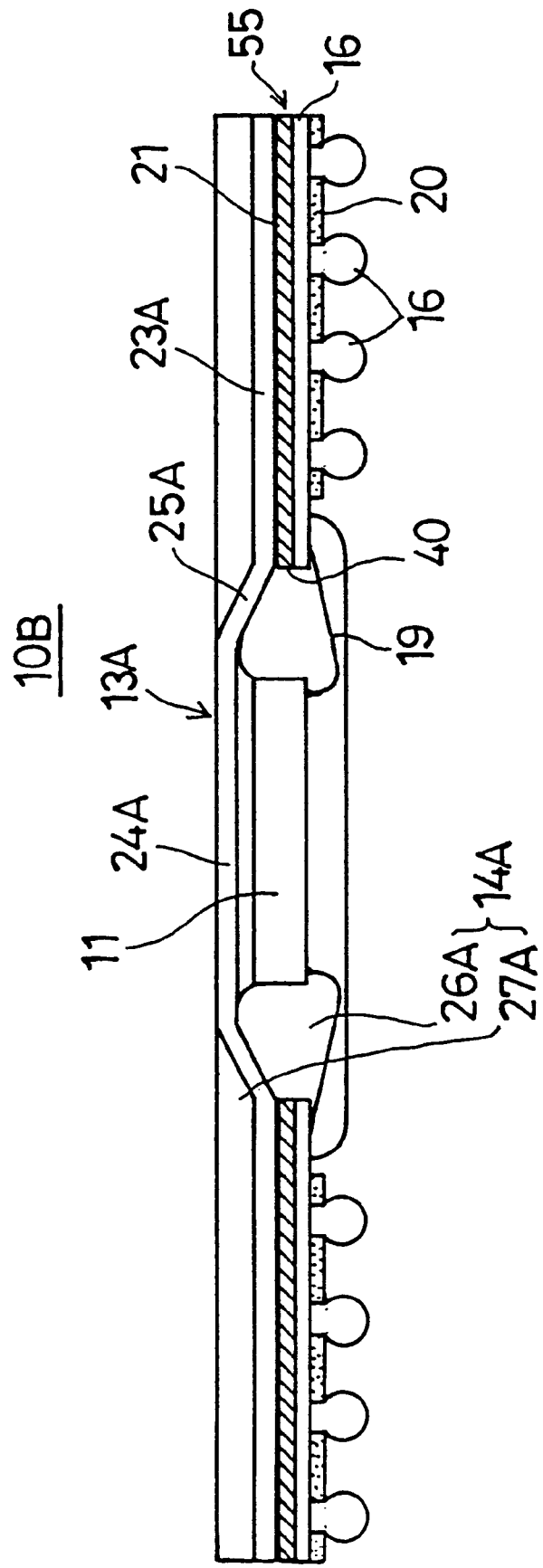
FIG. 14 illustrates a second embodiment of the semiconductor device of the present invention.

FIG. 14 illustrates a semiconductor device 10B of a second embodiment of the present invention. In the following descriptions of the embodiments of the present invention, the same components as in the first embodiment are indicated by the same reference numerals as in the semiconductor device 10A shown in FIG. 2.

In the semiconductor device 10A of the first embodiment, the printed wiring board 12A is used as a wiring board. In the semiconductor device 10B of this embodiment, a film-type board 55 having a tape material as a base material is used as the wiring board.

The base material of the film-type board 55 is polyimide, and the wiring layer 16 is copper foil as in the printed wiring board 12A. The film-type board 55 can improve the wiring density, because the wiring layer 16 can be made more minute compared with the printed wiring board 12A.

The film-type board 55 used as the wiring board is compatible with the high-density semiconductor chip 11. As the film-type board 55 is thinner than the printed wiring board 12A, the semiconductor device 10B can be made thinner than the semiconductor device 10A. As for a specific rule in pattern, the relationship between each line and space can be 30/30 µm.

Figure 15A:
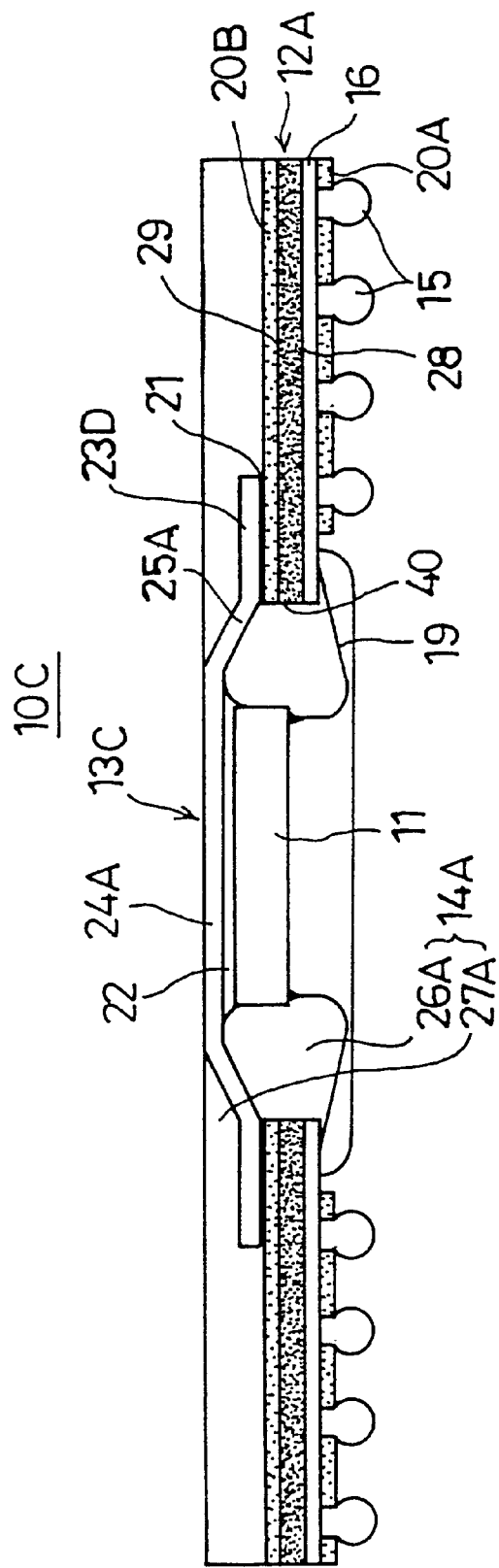
FIGS. 15A and 15B illustrate third and fourth embodiments of the semiconductor device of the present invention.
Figure 15B:
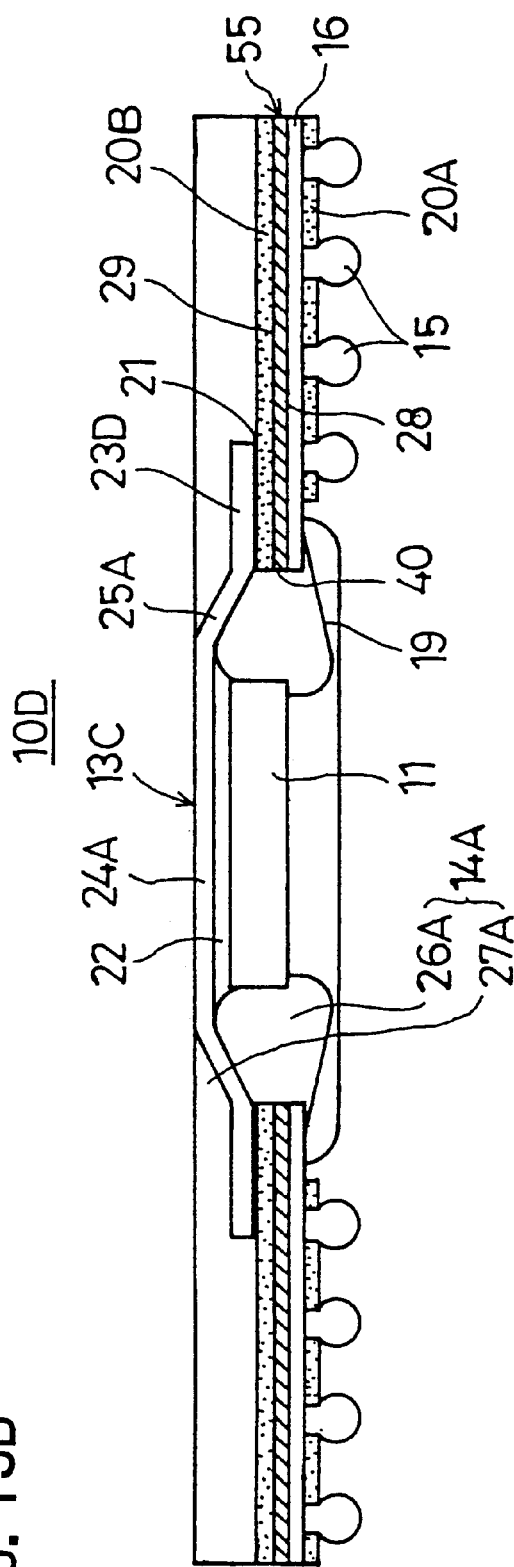

FIGS. 15A and 15B illustrate semiconductor devices 10C and 10D of third and fourth embodiments of the present invention.

The semiconductor device 10C of the third embodiment shown in FIG. 15A has a first resist 20A formed on the packaging side surface 28 of the printed wiring board 12A and a second resist 20B formed on the upper surface 29 opposite to the packaging side surface 28. Like the resist 20 provided to the semiconductor device 10A of the first embodiment, the first and second resists 20A and 20B function as solder resists, and are made of a resin material.

The first and second resin resists 20A and 20B sandwich the printed wiring board 12A, so that the first and second resin resists 20A and 20B are deformed in the same way when heat is applied. The printed wiring board 12A (or the semiconductor device 10C) is thus prevented from bending.

The semiconductor device 10D of the fourth embodiment shown in FIG. 15B has the film-type board 55 instead of the printed wiring board 12A in the semiconductor device 10C of the third embodiment shown in FIG. 15A.

In the semiconductor devices 10C and 10D, the length of a fixed portion 23D of a heat spreader 13C is shorter than that of the semiconductor device 10A or 10B. As long as the bonding between the heat spreader 13C and the printed wiring board 12A is maintained, the fixed portion 23D can be shorter. This can reduce the material cost.

Figure 16A:
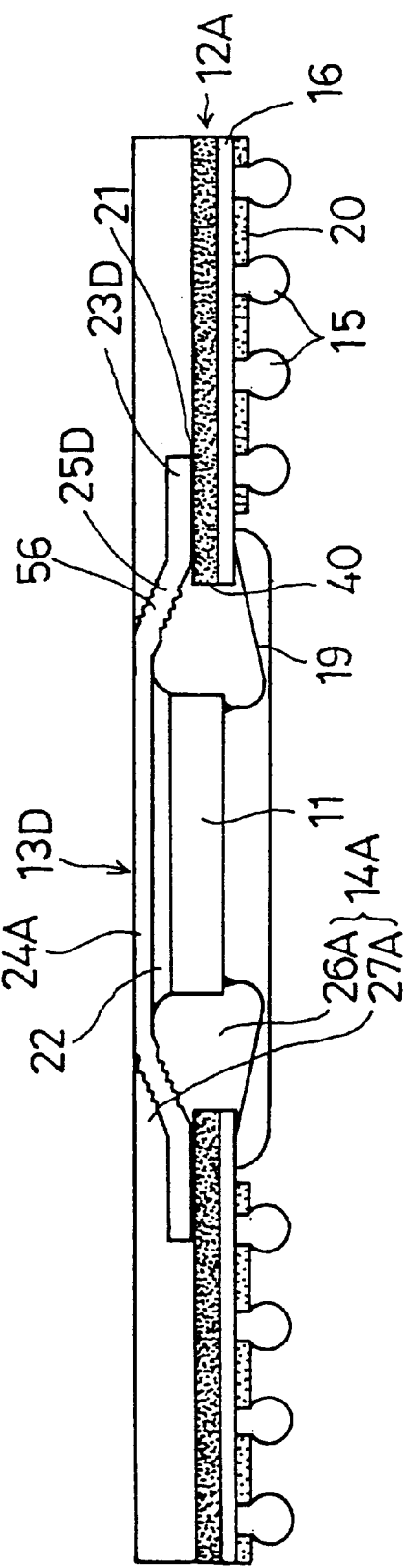
FIGS. 16A and 16B illustrate fifth and sixth embodiments of the semiconductor device of the present invention.
Figure 16B:
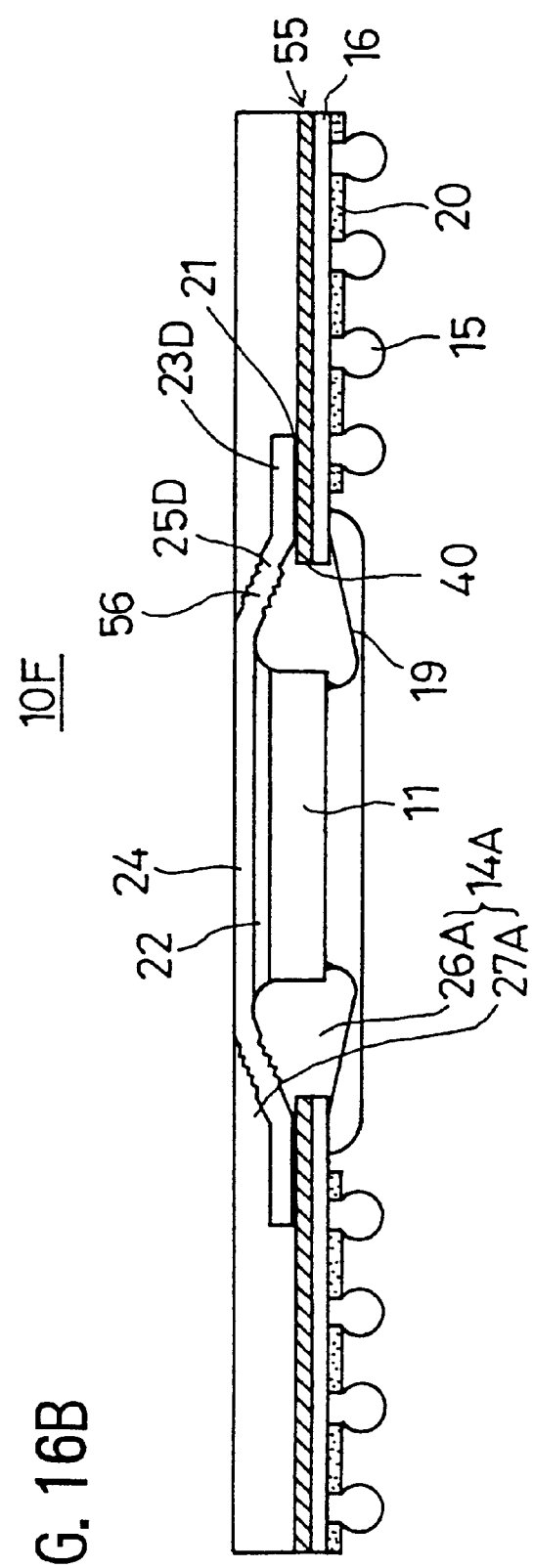

FIGS. 16A and 16B illustrate semiconductor devices 10E and 10F of fifth and sixth embodiments of the present invention.

The semiconductor device 10E of the fifth embodiment shown in FIG. 16A has an elastic portion 56 at each connecting portion 25D connecting the stage portion 24A and the fixed portion 23D formed in a heat spreader 13D. In this embodiment, each connecting portion 25D is crimped to form the elastic portion 56.

By forming the elastic portion 56 at each connecting portion 25D, the stage portion 24A can be shifted with respect to the fixed portion 23D. Even if the semiconductor chip 11 and the printed wiring board 12A change in thickness, resin molding can be carried out using the same metal mold (45 and 46) used for forming the sealing resin 14A.

The semiconductor chip 11 and the printed wiring board 12A might change in thickness depending on the structure of the semiconductor device. In such a case, if the connecting portions are inelastic like the connecting portions 25A of the first embodiment, the heat spreader 13 needs to be adjusted to the thicknesses of the semiconductor chip and the printed wiring board 12A. Because of this, it also becomes necessary to form the metal mold for the sealing resin 14A in accordance with the adjustment. As is well known, the cost for producing a metal mold is high, resulting in an increase of the production costs of the semiconductor device.

The elastic portion 56 at each connecting portion 25 of the present invention is designed to absorb a change in thickness of the semiconductor chip 11 or the printed wiring board 12A. Thus, the sealing resin 14A can be formed, without changing or adjusting the metal molds. Accordingly, a change in the semiconductor chip 11 or the printed wiring board 12A can be quickly accommodated, without causing an increase of the production costs of the semiconductor device 10E.

The semiconductor device 10F of the sixth embodiment shown in FIG. 16B has the film-type board 55 instead of the printed wiring board 12A in the semiconductor device 10E of the fifth embodiment shown in FIG. 16A.

Figure 17A:
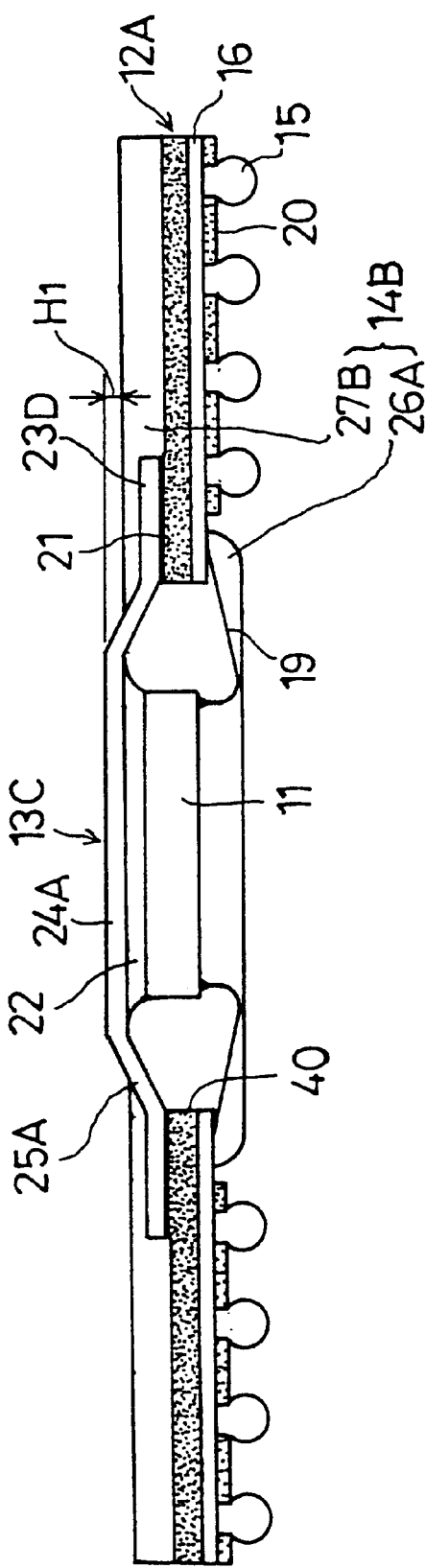
FIGS. 17A and 17B illustrate seventh and eighth embodiments of the semiconductor device of the present invention.
Figure 17B:
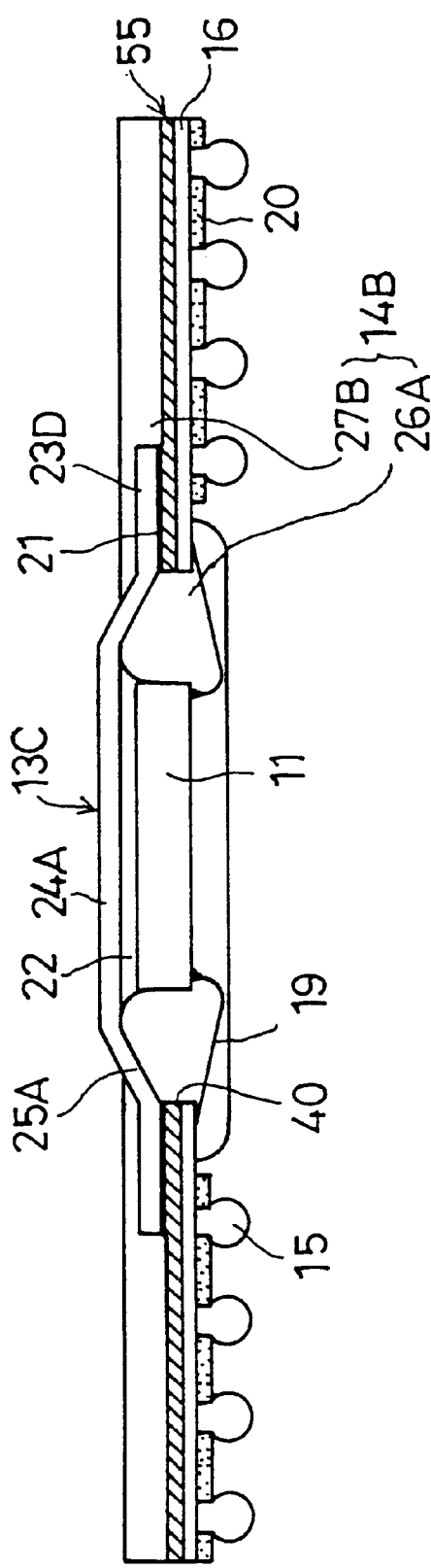

FIGS. 17A and 17B illustrate semiconductor devices 10G and 10H of seventh and eighth embodiments of the present invention.

The semiconductor device 10G of the seventh embodiment shown in FIG. 17A is characterized by the stage portion 24A protruding from the surface of a second sealing resin portion 27B. In this embodiment, the stage portion 24A protrudes by the length indicated by arrows H1 in FIG. 17A.

The stage portion 24A protruding from the surface of the second sealing resin portion 27B can be easily obtained by forming a cavity for accommodating the stage portion 24A in the lower cavity 49 (shown in FIG. 11B) of the lower mold 46 used in the sealing resin forming step (S6).

The stage portion 24A protruding from the surface of the second sealing resin portion 27B of this embodiment has a larger area exposed from the second sealing resin portion 27B than in the foregoing embodiments, and the exposed area is the heat releasing area. Thus, the heat generated from the semiconductor chip 11 can be more efficiently released.

The semiconductor device 10H of the eighth embodiment shown in FIG. 17B has the film-type board 55 instead of the printed wiring board 12A in the semiconductor device 10G of the seventh embodiment shown in FIG. 17A.

Figure 18A:
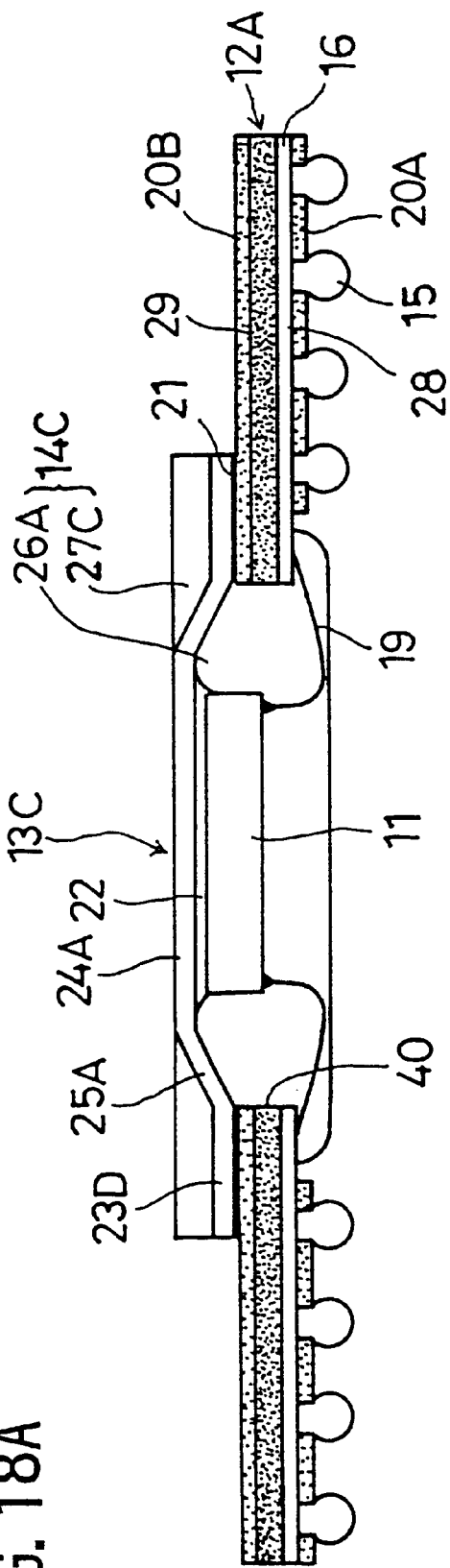
FIGS. 18A and 18B illustrate ninth and tenth embodiments of the semiconductor device of the present invention.
Figure 18B:
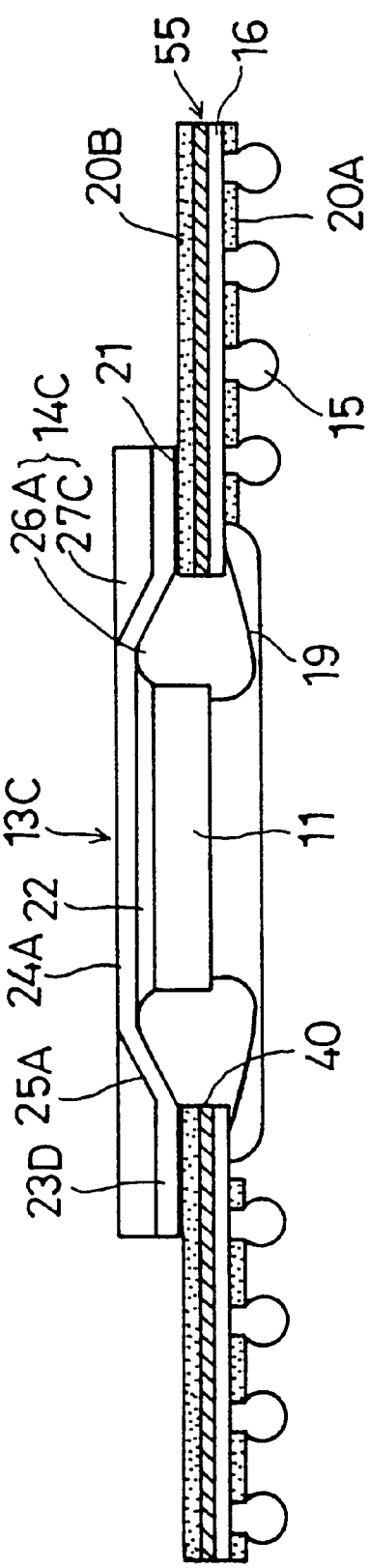

FIGS. 18A and 18B illustrate semiconductor devices 10I and 10J of ninth and tenth embodiments of the present invention.

The semiconductor device 10I of the ninth embodiment shown in FIG. 18A is characterized by a second sealing resin portion 27C having a smaller area than the printed wiring board 12A. In this structure, the upper surface 29 of the printed wiring board 12A is exposed, and the second resist 20B is formed on the upper surface 29 to protect the printed wiring board 12.

By making the area of the second sealing resin portion 27C small, the first sealing resin portion 26A and the second sealing resin portion 27C can be similar in area. If heating is performed at the time of packaging, the thermal expansion of the first sealing resin portion 26A can be almost the same as the thermal expansion of the second sealing resin portion 27C. Thus, the heat spreader 13C can be prevented from being bent due to the heat.

The semiconductor device 10J of the tenth embodiment shown in FIG. 18B has the film-type board 55 instead of the printed wiring board 12A in the semiconductor device 10I of the ninth embodiment shown in FIG. 18A.

Figure 19:
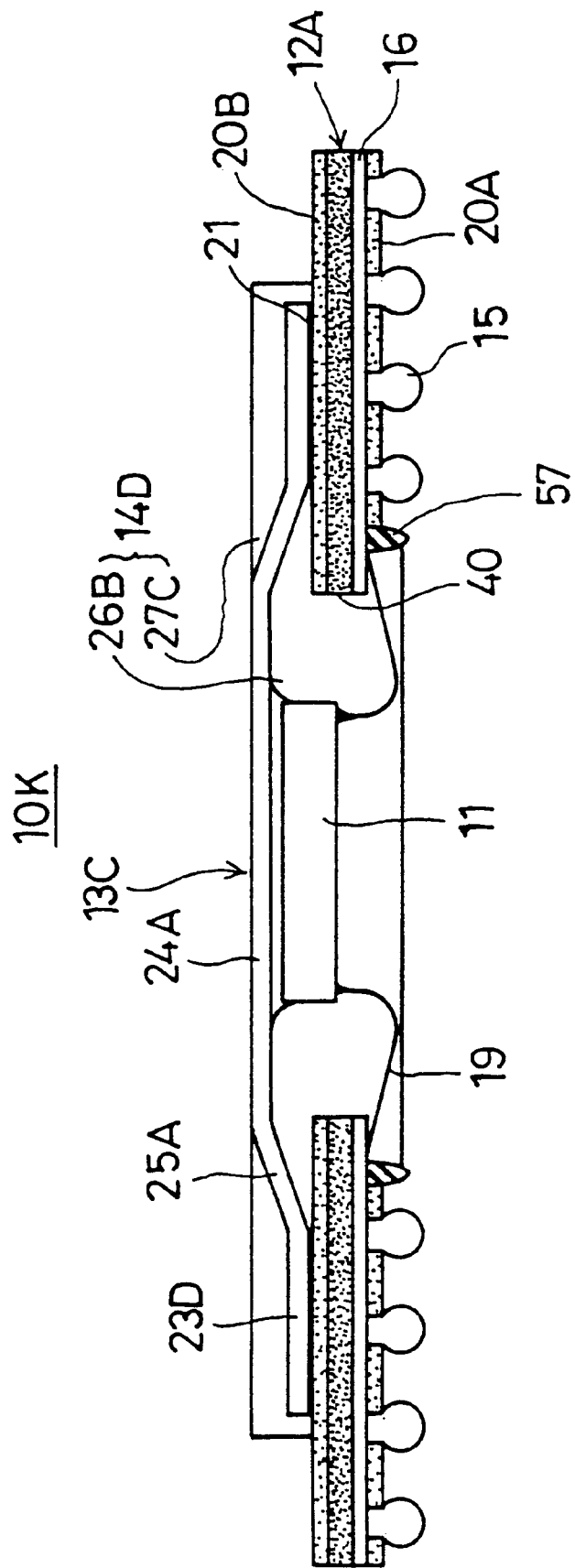
FIG. 19 illustrates an eleventh embodiment of the semiconductor device of the present invention.

FIG. 19 illustrates a semiconductor device 10K of an eleventh embodiment of the present invention.

The semiconductor device 10K of this embodiment has a first sealing resin portion 26B formed by a screen printing method. A dam member 57 for preventing resin flow at the time of printing is formed near the opening 40 of the printed wiring board 12A.

By employing the screen printing method to form the first sealing resin portion 26B, the resin filling pressure can be lower than the pressure caused in resin formation by the transfer molding method. Thus, the wires 19 can be prevented from moving at the time of resin formation. If the wire pitch of the wires 19 becomes narrow due to a high density, a short circuit among the wires can be avoided. Compared with the transfer molding method, the screen printing method can also reduce the equipment cost, thereby reducing the costs of the semiconductor device 10K.

In this embodiment, the first sealing resin portion 26B and the second sealing resin portion 27C need to be produced separately. More specifically, the first sealing resin portion 26B is formed by the screen printing method, and cured. After the curing, the second sealing resin portion 27C is formed by the transfer molding method.

Although the printed wiring board 12A is used as a wiring board in this embodiment, the film-type board 55 can be employed in place of the printed wiring board 12A.

Figure 20:
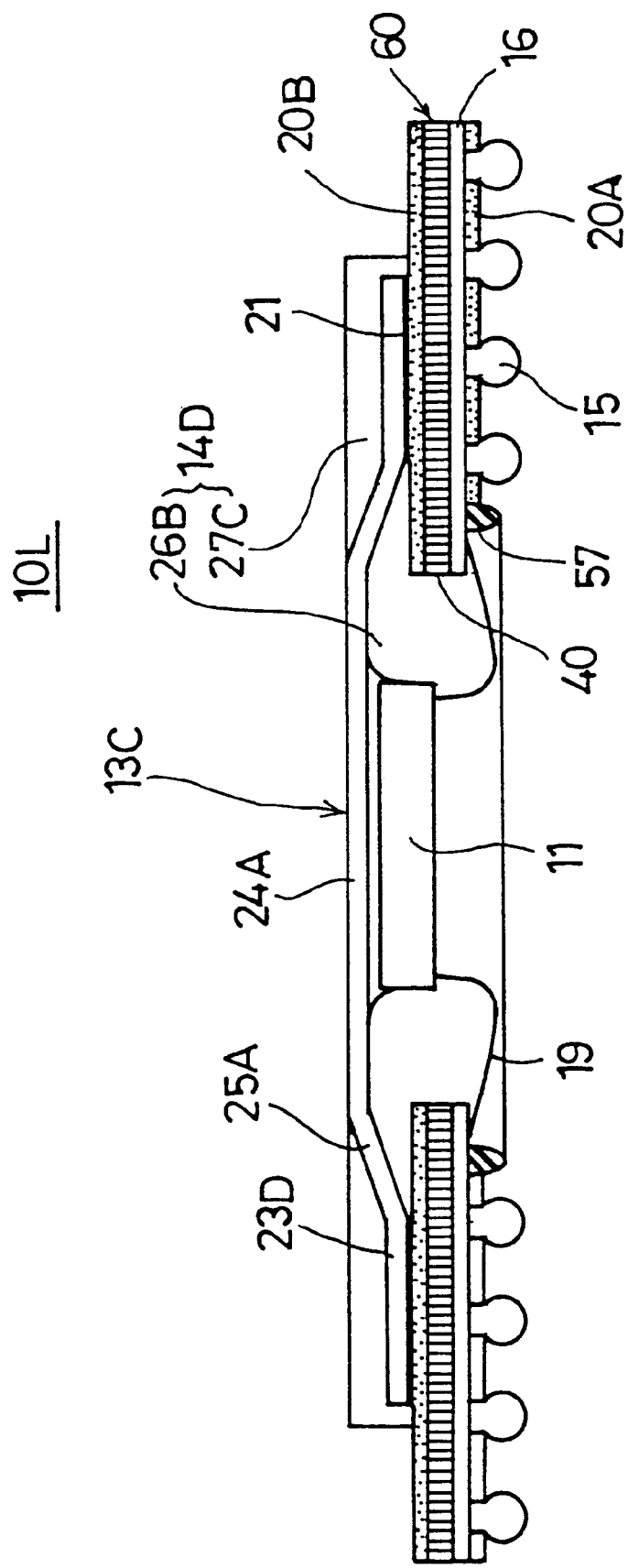
FIG. 20 illustrates a twelfth embodiment of the semiconductor device of the present invention.

FIG. 20 illustrates a semiconductor device 10L of a twelfth embodiment of the present invention.

The semiconductor device 10L of this embodiment has an inorganic material board 60 as a wiring board made of an inorganic material such as ceramic (hereinafter referred to as a ceramic wiring board).

Compared with the printed wiring board 12A, the ceramic wiring board 60 of this embodiment can have a higher wire density, and is compatible with a high density semiconductor chip 11. As the ceramic wiring board 60 does not absorb moisture, cracking due to vapor can be avoided at the time of heating. Thus, the semiconductor device 10L can have high reliability.

Figure 21:
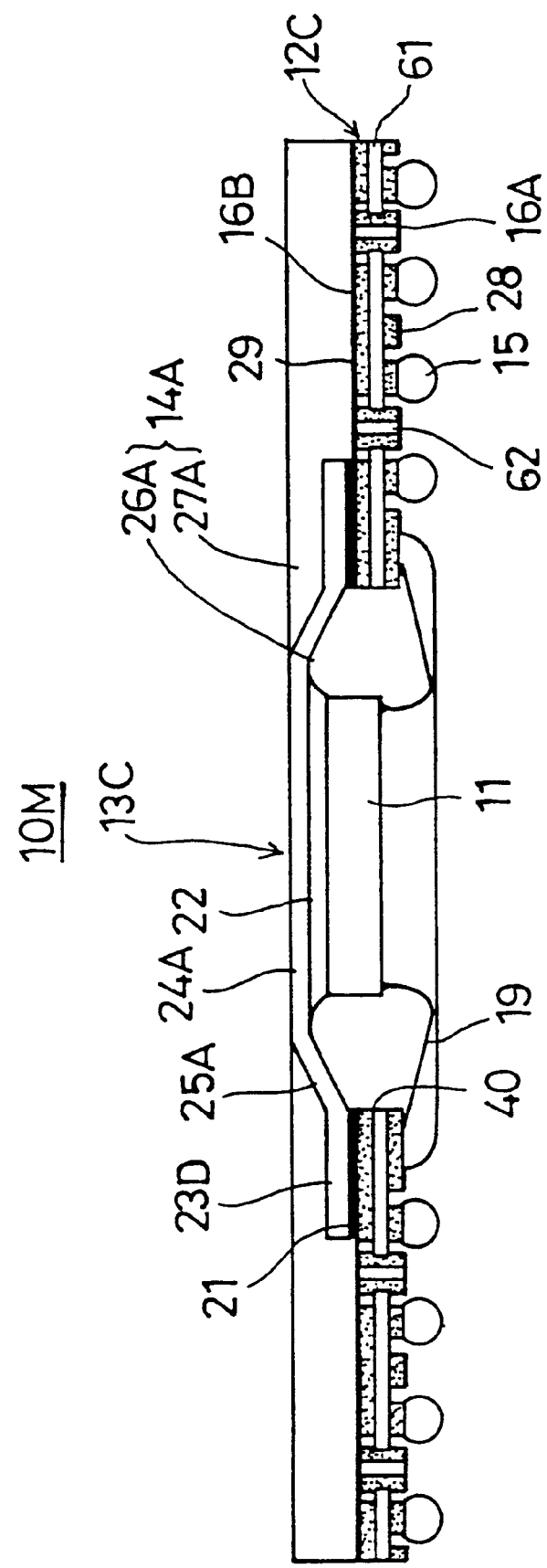
FIG. 21 illustrates a thirteenth embodiment of the semiconductor device of the present invention.
Figure 22:
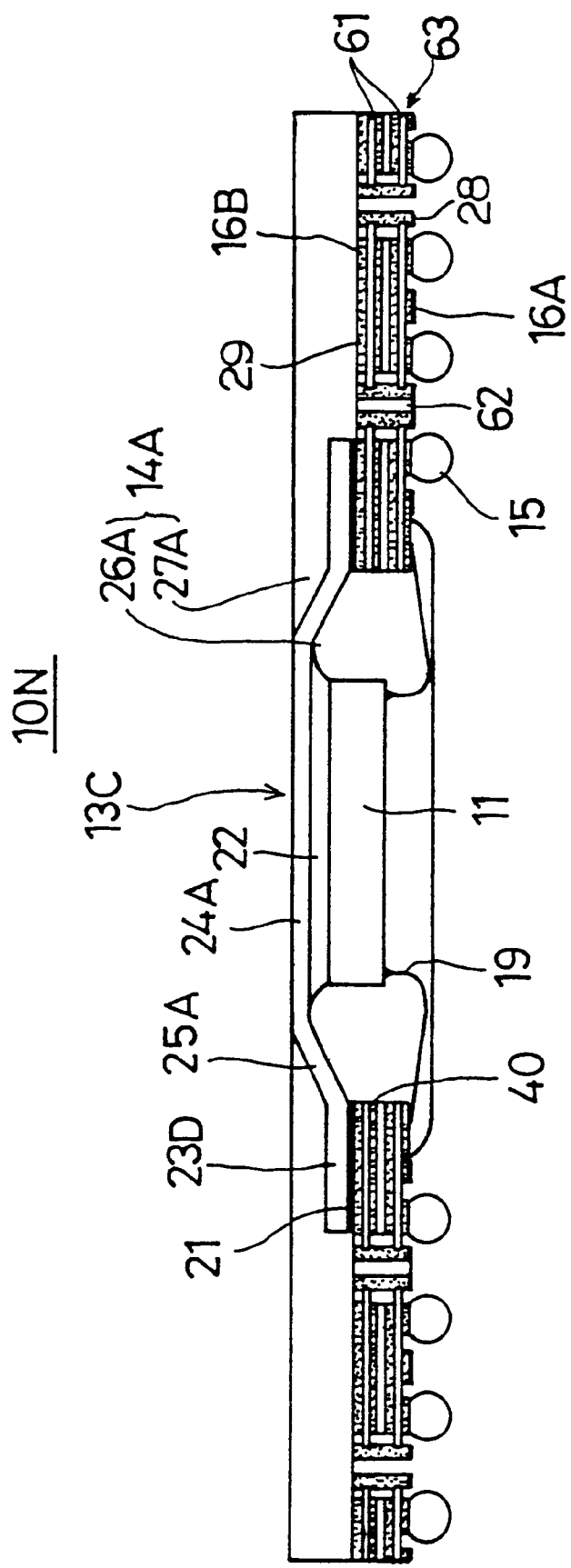
FIG. 22 illustrates a fourteenth embodiment of the semiconductor device of the present invention.

FIGS. 21 and 22 illustrate semiconductor devices 10M and 10N of thirteenth and fourteenth embodiments of the present invention.

The semiconductor device 10M of the thirteenth embodiment shown in FIG. 21 has a first wiring layer 16A formed on the packaging side surface 18 of a printed wiring board 12C, and a second wiring layer 16B formed on the upper surface 29 of the printed wiring board 12C opposite to the packaging side surface 28.

The semiconductor device 10N of the fourteenth embodiment shown in FIG. 22 has a multi-layer printed wiring board 63 having a laminated structure as a wiring board. The multi layer printed wiring board 63 of this embodiment is provided with the first and second wiring layers 16A and 16B on opposite surfaces.

Since the semiconductor devices 10M and 10N both have the first and second wiring layers 16A and 16B on opposite surfaces of the printed wiring board 12C and the multi layer printed wiring board 63 as the circuit boards, an internal wiring layer 61 and vias 62 for electrically connecting the wiring layers 16A and 16B are formed inside each of the wiring boards 12C and 63.

Besides the first wiring layer 16A formed on the packaging side surface 28 of each of the wiring boards 12C and 63, the semiconductor device 10M of the thirteenth embodiment is provided with the second wiring layer 16B on the upper surface 29. On the other hand, the semiconductor device iON employs the multi layer printed wiring board 63 having a laminated structure. These factors can improve the degree of freedom and also narrow the gaps in the wiring pattern. Thus, the high density semiconductor chip 11 can be accommodated.

Figure 23:
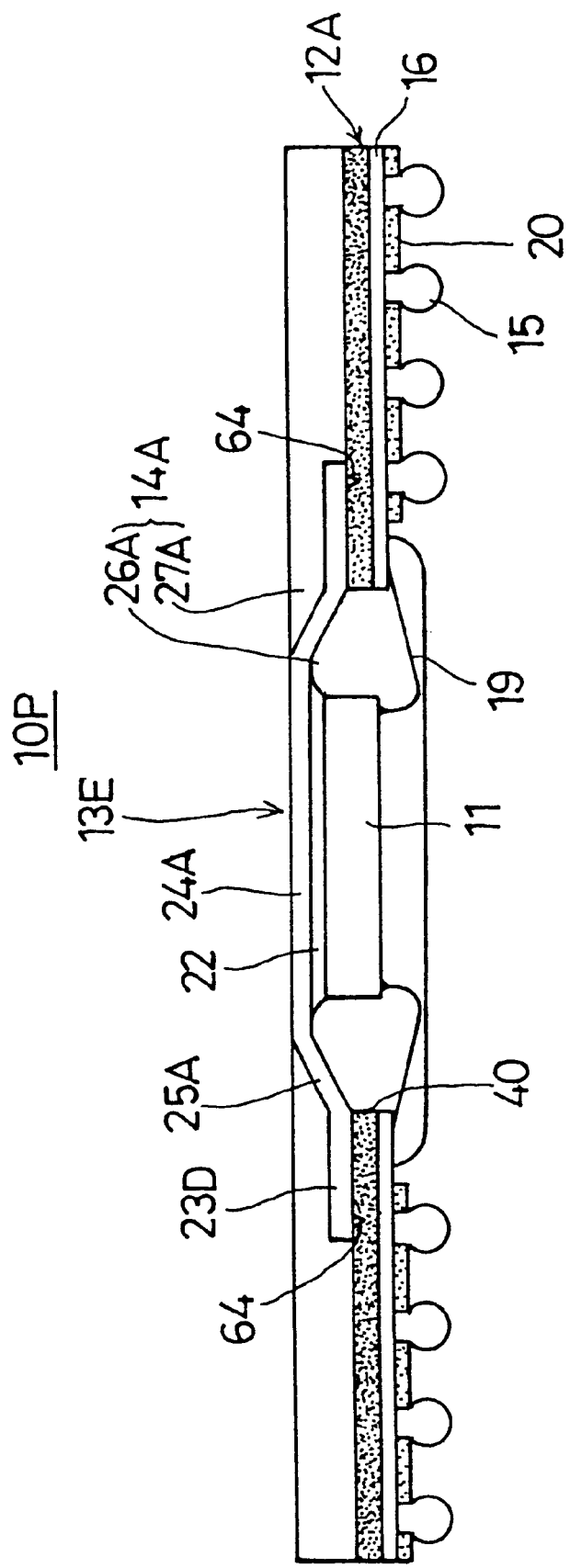
FIG. 23 illustrates a fifteenth embodiment of the semiconductor device of the present invention.
Figure 24:
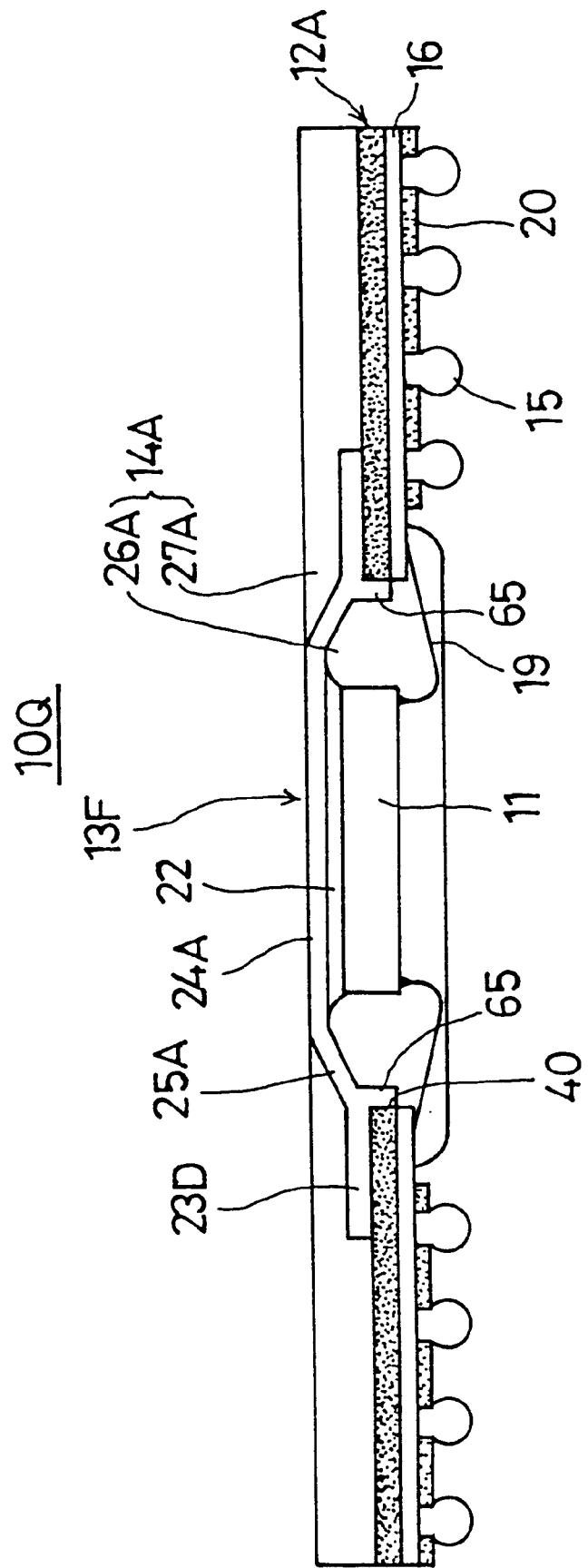
FIG. 24 illustrates a sixteenth embodiment of the semiconductor device of the present invention.

FIGS. 23 and 24 illustrate semiconductor devices 10P and 10Q of fifteenth and sixteenth embodiments of the present invention.

The semiconductor device 10P of the fifteenth embodiment shown in FIG. 23 has an anchor portion 64 wedged into the printed wiring board 12A. The anchor portion 64 is integrally formed with the fixed portion 23D of a heat spreader 13E in the heat spreader forming step (S2). The anchor portion 64 is long enough to fix the heat spreader 13E to the printed wiring board 12A.

The semiconductor device 10Q of the sixteenth embodiment shown in FIG. 24 has an engaging portion 65 extending downward from a heat spreader 13F. The engaging portion 65 Is engaged with the opening 40.

The anchor portion 64 provided to the heat spreader 13E and the engaging portion 65 provided to the heat spreader 13F can mechanically fix both heat spreaders 13E and 13F to the respective printed wiring boards 12A.

In this embodiment, no adhesives are necessary in bonding the heat spreader and the printed wiring board, because the heat spreaders 13E and 13F can be directly fixed to the respective printed wiring boards 12A. Accordingly, the number of components can be smaller, and the production procedures can be simpler.

Figure 25:
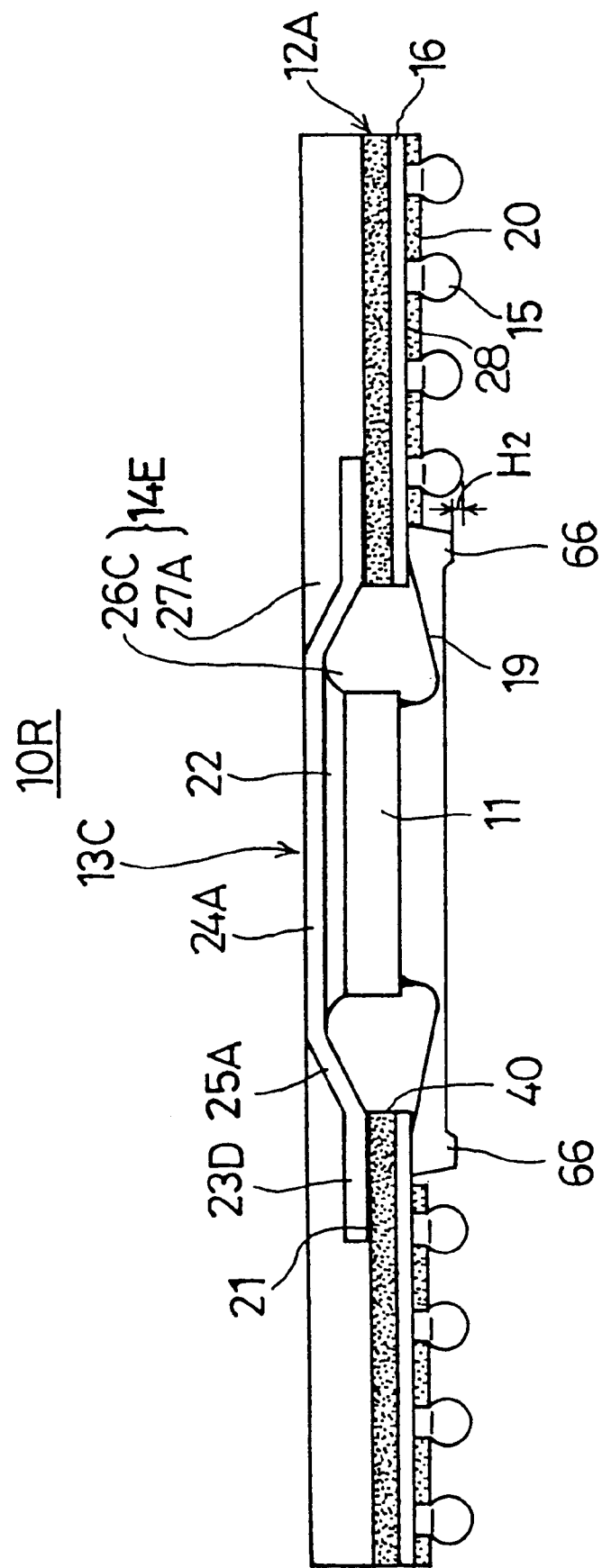
FIG. 25 illustrates a seventeenth embodiment of the semiconductor device of the present invention.

FIG. 25 illustrates a semiconductor device 10R of a seventeenth embodiment of the present invention.

The semiconductor device 10R of this embodiment has a protruding portion 66 integrally formed with a first sealing resin portion 26C. The protruding portion 66 protrudes in the same direction as the protruding direction of the solder balls 15. The protruding portion 66 is more protruding than the packaging side surface 28 of the printed wiring board 12A, but the solder balls 15 are more protruding than the protruding portion 66 by the length indicated by arrows H2 in FIG. 25.

The protruding portion 66 provided to the first sealing resin portion 26C can prevent the semiconductor device 10R from shifting at the time of packaging. When the semiconductor device 10R is mounted to a packaging substrate (not shown), the semiconductor device 10R is supported by the solder balls 15 onto the packaging substrate prior to the melting of the solder balls 15. After heat is applied for the packaging, the melted solder balls 15 can no longer support the semiconductor device 10R.

Without the protruding portion 66, the printed wiring board 12A shifts toward the packaging substrate due to the weight of the semiconductor device 10R itself. This causes bridging between the melted solder balls 15. The semiconductor device 10R floats on the melted solder balls 15, and can be deviated by even a small external force.

In this embodiment, the protruding portion 66 protruding from the printed wiring board 12A can support the semiconductor device 10R on the packaging substrate even after the melting of the solder balls 15. Thus, bridging between the melted solder balls 15 can be avoided, and the semiconductor device 10R can be prevented from deviating on the packaging substrate.

When the solder balls 15 have not yet melted, the height of the protruding portion 66 is smaller than the height of the solder balls 15, so that the protruding portion 66 is not brought into contact with the packaging substrate.

Figure 26:
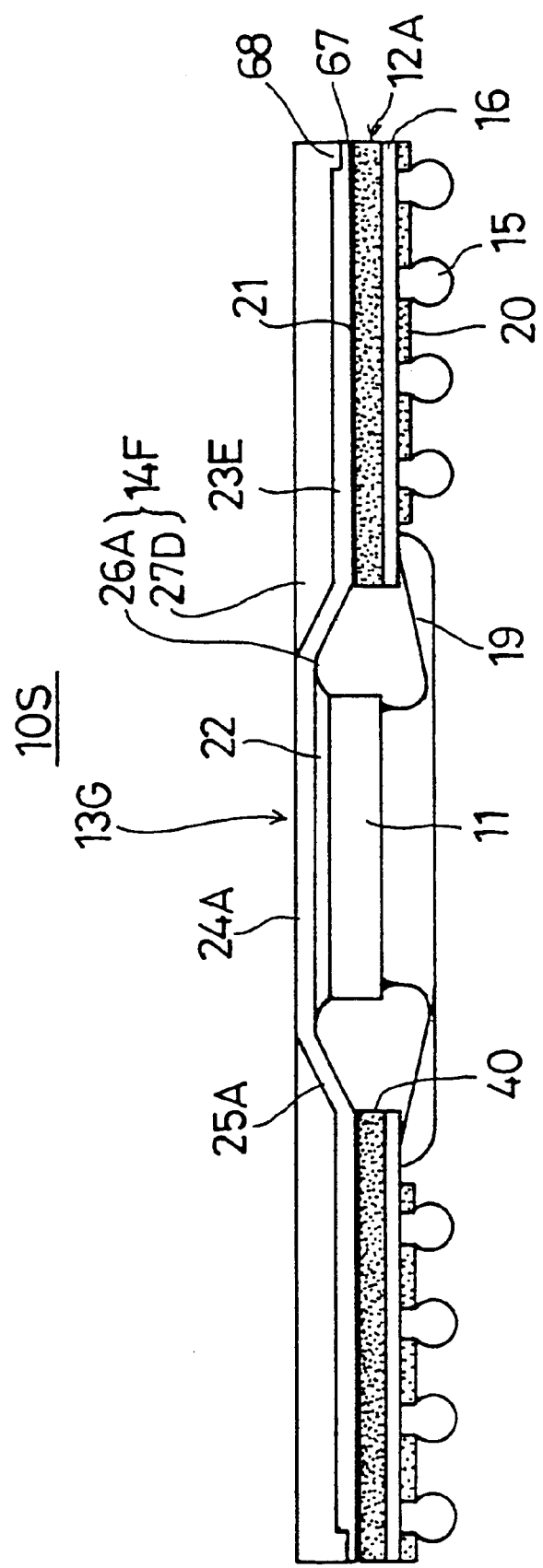
FIG. 26 illustrates an eighteenth embodiment of the semiconductor device of the present invention.
Figure 27:
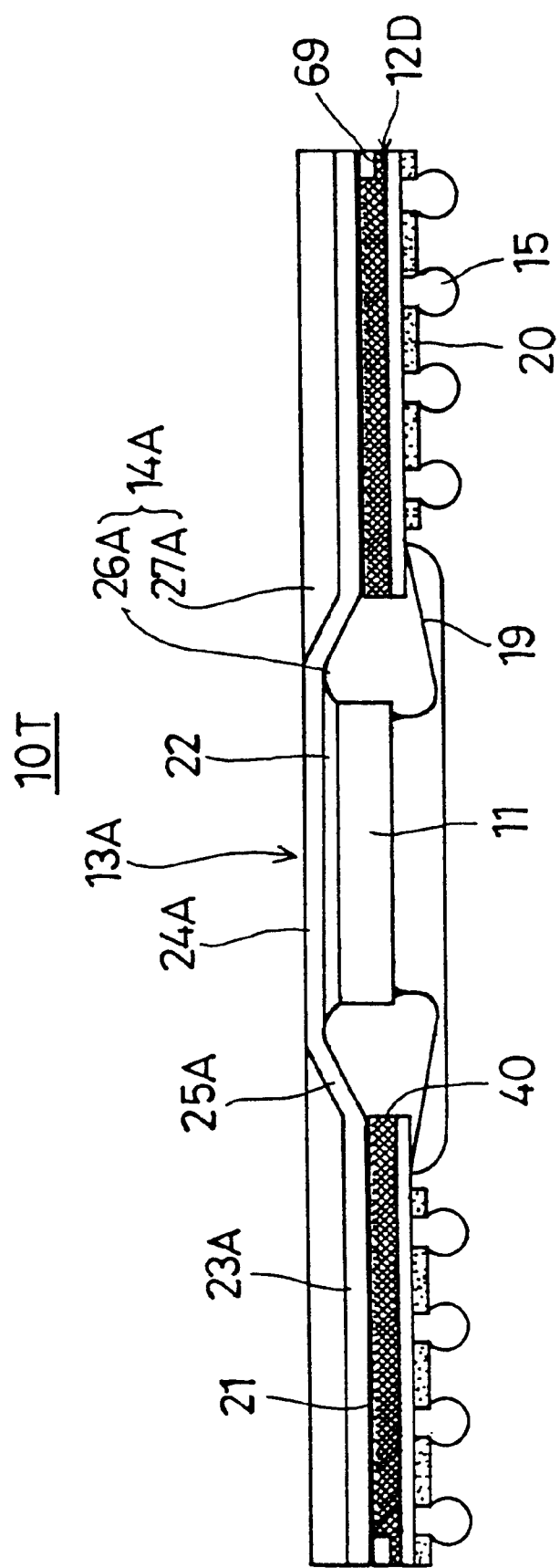
FIG. 27 illustrates a nineteenth embodiment of the semiconductor device of the present invention.

FIGS. 26 and 27 illustrate semiconductor devices 10S and 10T of eighteenth and nineteenth embodiments of the present invention.

The semiconductor device 10S of the eighteenth embodiment shown in FIG. 26 has a thin portion 67 on the outer periphery of a fixed portion 23E of a heat spreader 13G. The outer periphery of the heat spreader 13G is where the blade cutting is carried out in the cutting step (S9).

The thin portion 67 is formed in the blade cutting position. As for the process of forming the thin portion 67, it is possible to form the thin portion 67 at the same time as forming the cutting slits 30 by stamping in the heat spreader forming step (S2), for instance.

The thin portion 67 formed on the outer periphery of the heat spreader 13G, where the cutting step is carried out, can reduce the load applied to the blade used for the cutting. In the sealing resin forming step (S6), a second sealing resin portion 27D enters the thin portion 67 to form an anchor portion 68, so that the bond between the second sealing resin portion 27D and the heat spreader 13G can be improved.

The semiconductor device 10T of the nineteenth embodiment shown in FIG. 27 has a base thin portion 69 on the outer periphery of a printed wiring board 12D. The base thin portion 69 formed on the outer periphery of the printed wiring board 12D, where the cutting step is carried out, can reduce the load applied to the blade used for the cutting, as in the eighteenth embodiment.

Figure 28:
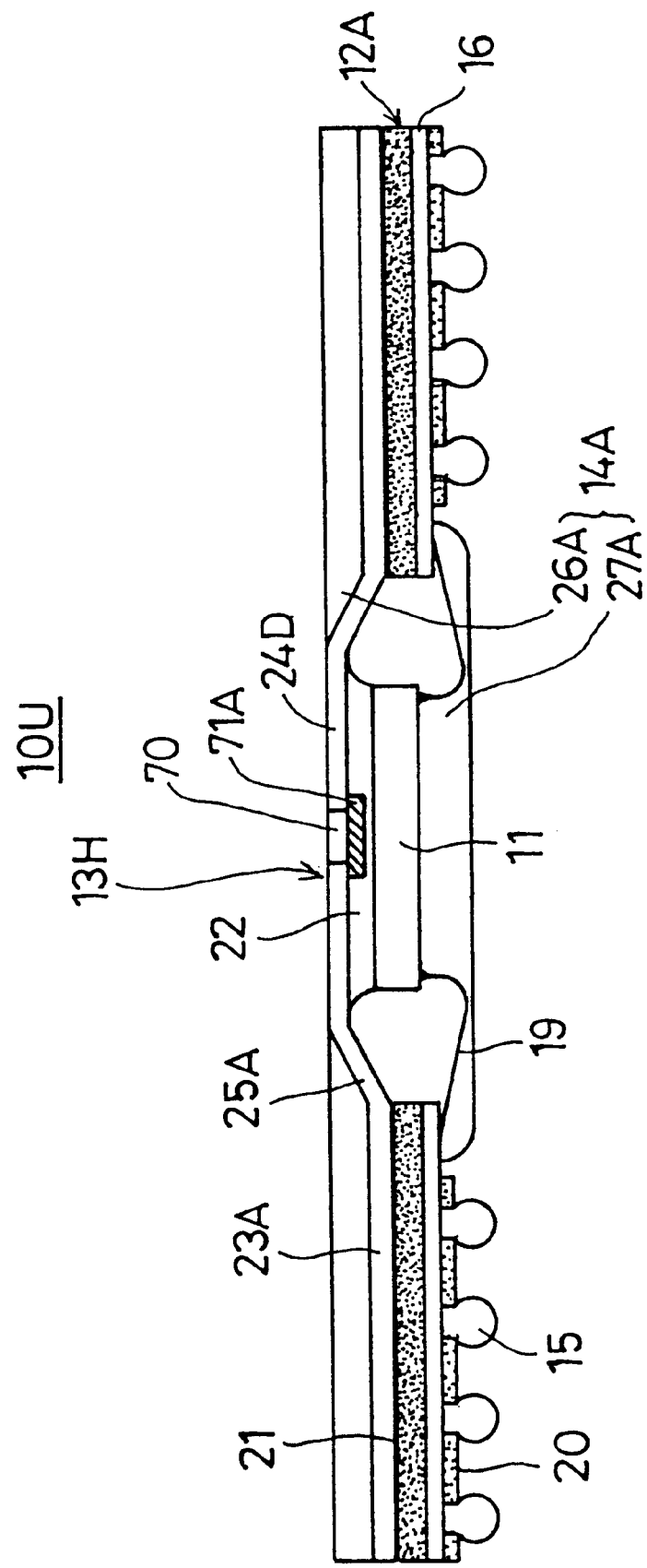
FIG. 28 illustrates a twentieth embodiment of the semiconductor device of the present invention.
Figure 29:
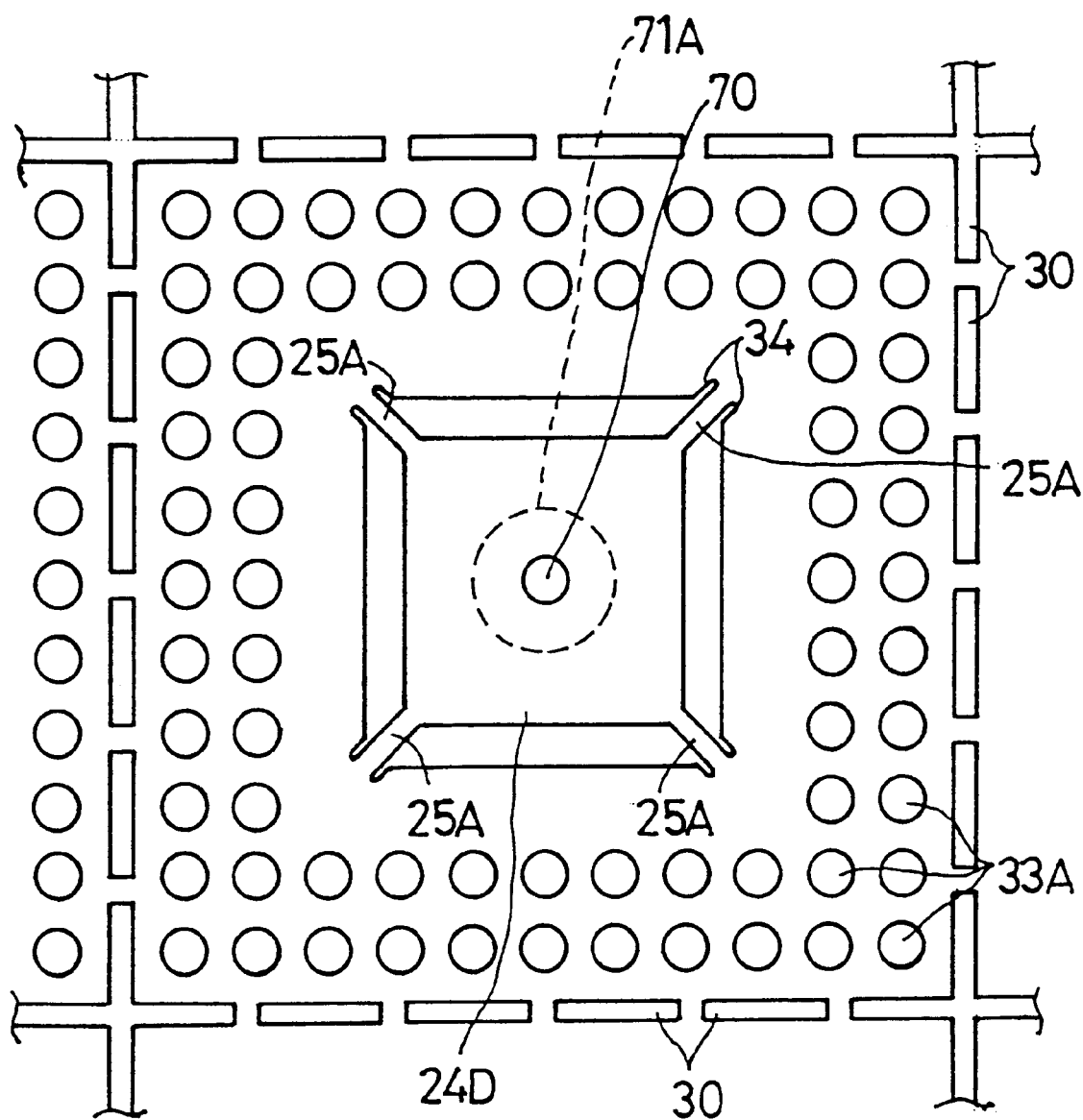
FIG. 29 is an enlarged view of a heat spreader in the semiconductor device of the twentieth embodiment.

FIGS. 28 and 29 illustrate a semiconductor device 10U of a twentieth embodiment of the present invention.

FIG. 28 is a sectional view of the semiconductor device 10U of this embodiment, and FIG. 29 is an enlarged plan view of a heat spreader 13H disposed in the semiconductor device 10U.

The semiconductor device 10U has a vent hole 70 for releasing vapor from inside the device at the time of packaging. The vent hole 70 is formed in a stage portion 24D provided to the heat spreader 13H. As shown in FIG. 29, the vent hole 70 is formed in the center of the stage portion 24D, and has a circular shape. However, the position of the vent hole 70 is not limited to the center of the stage portion 24D, and the number and shape of the vent hole 70 can be different from those in this embodiment.

The vent hole 70 formed in the stage portion 24D exposed from the sealing resin 14A (or the first sealing resin portion 26A) can release vapor caused by the heat applied at the time of packaging. Accordingly, when heating is carried out, the semiconductor device 10U can be prevented from sustaining damage such as cracks, and the reliability of the semiconductor device 10U can be improved.

When the semiconductor chip 11 is mounted to the stage portion 24D in the semiconductor chip mounting step (S4), the second adhesive 22 leaks from the vent hole 70 formed in the stage portion 24D. To avoid this, a tape member 71A for blocking the vent hole 70 is attached to the surface on the semiconductor chip mounting side of the stage 24D in this embodiment.

The tape member 71A for blocking the vent hole 70 can prevent the second adhesive 22 from leaking from the vent hole 70 in the semiconductor chip mounting step (S4), thereby assuring the mounting of the semiconductor chip 11 to the stage portion 24D.

The tape member 71A of this embodiment is holed prior to the heating of the semiconductor device 10U. To form a hole in the tape member 71A, the vent hole 70 is subjected to laser irradiation, or a jig is inserted into the vent hole 70.

A tape having high heat resistance, such as Kapton, can be used as the tape member 71A of this embodiment. However, the tape member 71A is not limited to Kapton, and other materials can be employed as long as they have strong adhesion and heat resistance.

Figure 30:
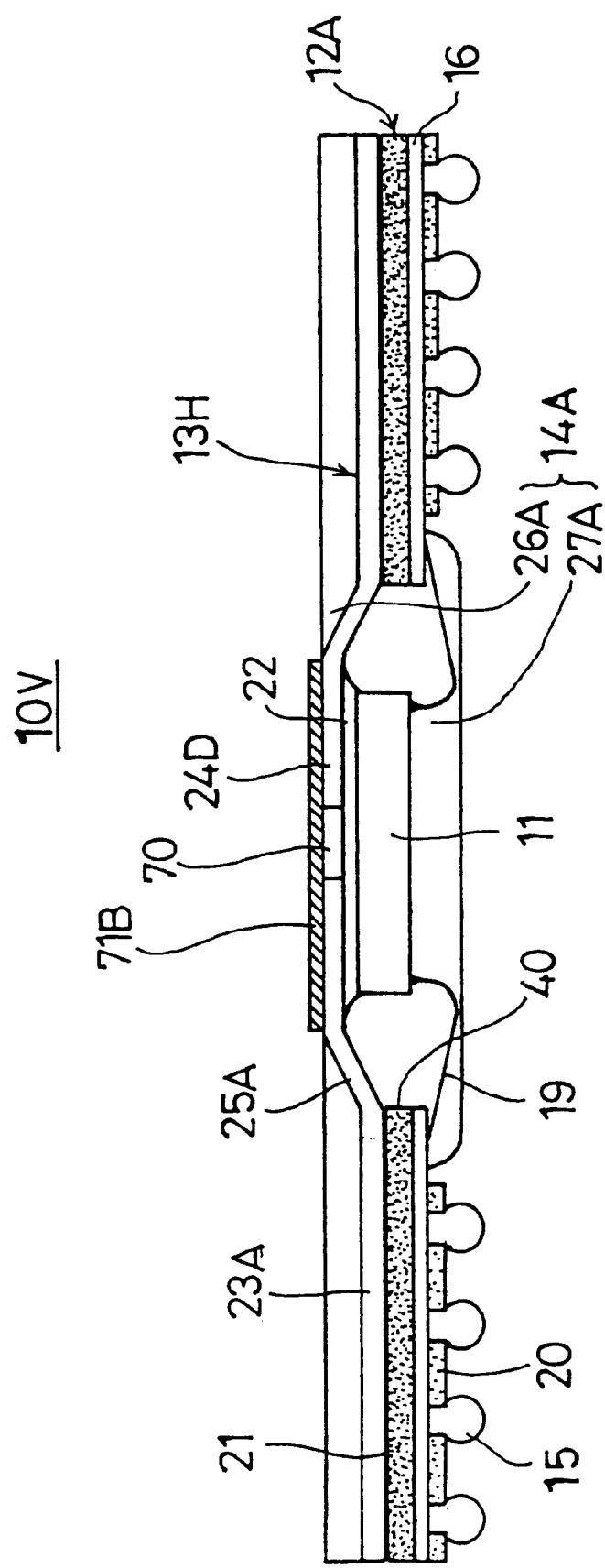
FIG. 30 illustrates a twenty-first embodiment of the semiconductor device of the present invention.

FIG. 30 illustrates a semiconductor device 10V of a twenty-first embodiment of the present invention.

The semiconductor device 10V of this embodiment has the vent hole 70 for releasing vapor at the time of heating, as in the semiconductor device 10U of the twentieth embodiment. Although the tape member 71A for preventing the second adhesive 22 from leaking is attached to the semiconductor chip mounting surface of the stage portion 24D in the twentieth embodiment, a tape member 71B is attached to the outer exposed surface of the stage portion 24D in this embodiment.

Being attached to the outer exposed surface of the stage portion 24D, the tape member 71B of this embodiment can be removed from the outside of the semiconductor device 10V. Compared with the twentieth embodiment, removing the tape member 71B is easier.

A UV tape which loses adhesion by ultraviolet rays can be used as the tape member 71B.

Figure 31:
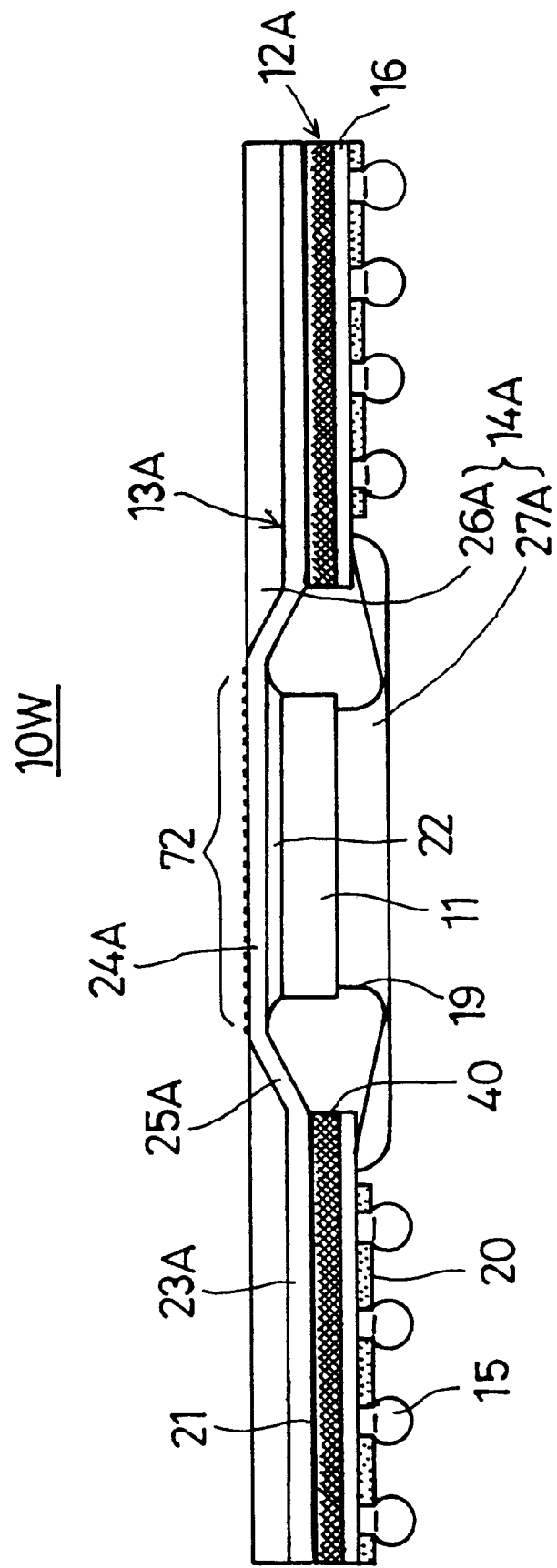
FIG. 31 illustrates a twenty-second embodiment of the semiconductor device of the present invention.

FIG. 31 illustrates a semiconductor device 10W of a twenty-second embodiment of the present invention.

The semiconductor device low of the twenty-second embodiment has a plating portion 72 having corrosion resistance on the exposed surface of the stage portion 24A.

If copper (Cu) is used for the heat spreader 13A, and epoxy resin is used for the sealing resin 14A, it is advantageous to bond the heat spreader 13A and the sealing resin 14A without plating, because both copper and epoxy have excellent bonding properties. However, copper easily discolors or corrodes when exposed to the air. In the semiconductor device low having the stage portion 24A exposed from the first sealing resin portion 26A, the stage portion 24A made of copper discolors or corrodes, and lowers the quality of the device.

To avoid such discoloration and corrosion, the plating portion 72 is formed only in the stage portion 24a exposed to the outside. The plating portion 72 prevents the stage portion 24A from discoloring and corroding while maintaining the bond between the heat spreader 13A and the sealing resin 14A. Thus, the quality of the semiconductor device 10W can be maintained for a long period of time.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

The present application is based on Japanese priority application No. 10-327193, filed on Nov. 17, 1998, the entire contents of which are hereby incorporated by reference.

What is claimed is:

1. A semiconductor device comprising:
   a semiconductor chip;
   a heat spreading plate having a stage portion, the semiconductor chip being mounted on the heat spreading plate;
   a wiring board supported by the heat spreading plate, the semiconductor chip and the wiring board being arranged side by side; and
   a sealing resin which seals the semiconductor chip and the heat spreading plate so that the stage portion of the heat spreading plate is exposed from the sealing resin and a remaining surface portion of the heat spreading plate is covered by the sealing resin.

2. The semiconductor device according to claim 1, wherein:
   the wiring board includes a first wiring layer formed on a packaging side surface of the wiring board, and an opening portion through which the semiconductor chip is mounted; and the first wiring layer includes an outer portion having external connecting terminals, and an inner portion having wires electrically connected to the semiconductor chip.

3. A semiconductor device comprising:
a semiconductor chip;
a heat spreading plate having a stage portion, the semiconductor chip being mounted on the heat spreading plate;
a wiring board supported by the heat spreading plate; and
a sealing resin which seals the semiconductor chip and the heat spreading plate so that the stage portion is exposed from the sealing resin, wherein
the heat spreading plate further includes a fixed portion on a side surface opposite to a packaging side surface of the wiring board, and connecting portions for connecting the fixed portion and the stage portion; and
the stage portion of the heat spreading plate is sunken from the fixed portion in a position facing an opening portion of the wiring board, and the thermally connected to the semiconductor chip.

4. A semiconductor device comprising:
a semiconductor chip;
a heat spreading plate having a stage portion, the semiconductor chip being mounted on the heat spreading plate;
a wiring board supported by the heat spreading plate; and
a sealing resin which seals the semiconductor chip and the heat spreading plate so that the stage portion is exposed from the sealing resin, wherein
the sealing resin includes a first sealing resin portion formed on a semiconductor chip bonding surface of the heat spreading plate, and a second sealing resin portion of the sealing resin formed on a surface opposite the semiconductor chip bonding surface of the heat spreading plate; and
the stage portion is exposed from the second sealing resin portion.

5. A semiconductor device comprising:
a semiconductor chip;
a heat spreading plate having a stage portion, the semiconductor chip being mounted on the heat spreading plate;
a wiring board supported by the heat spreading plate; and
a sealing resin which seals the semiconductor chip and the heat spreading plate so that the stage portion is exposed from the sealing resin,
wherein the wiring board is a film-type board having a tape material as a base material.

6. A semiconductor device comprising:
a semiconductor chip;
a heat spreading plate having a stage portion, the semiconductor chip being mounted on the heat spreading plate;
a wiring board supported by the heat spreading plate; and
a sealing resin which seals the semiconductor chip and the heat spreading plate so that the stage portion is exposed from the sealing resin
wherein the wiring board is an inorganic board made of an inorganic material.

7. A semiconductor device comprising:
a semiconductor chip;
a heat spreading plate having a stage portion, the semiconductor chip being mounted on the heat spreading plate;
a wiring board supported by the heat spreading plate; and
a sealing resin which seals the semiconductor chip and so that the stage portion is exposed from the sealing resin,
wherein a first resist is formed on a packaging side surface of the wiring board, and a second resist is formed on a side surface opposite to the packaging side surface of the wiring board.

8. The semiconductor device according to claim 1, wherein the heat spreading plate extends to an edge of the wiring board.

9. The semiconductor device according to claim 3, wherein an elastic portion is formed at each of the connecting portions connecting the fixed portion and the stage portion.

10. The semiconductor device according to claim 4, wherein the stage portion protrudes from a surface of the second sealing resin portion.

11. The semiconductor device according to claim 4, wherein an area of the second sealing resin portion is smaller than an area of the wiring board.

12. A semiconductor device comprising:
a semiconductor chip;
a heat spreading plate having a stage portion, the semiconductor chip being mounted on the heat spreading plate;
a wiring board supported by the heat spreading plate; and
a sealing resin which seals the semiconductor chip and the heat spreading plate so that the stage portion is exposed from the sealing resin, wherein
the wiring board includes a first wiring layer formed on a packaging side surface of the wiring board, and an opening portion through which the semiconductor chip is mounted; and
the first wiring layer includes an outer portion having external connecting terminals, and an inner portion having wires electrically connected to the semiconductor chip,
wherein the wiring board further includes a second wiring layer formed on a side surface opposite to the packaging side surface of the wiring board.

13. A semiconductor device comprising:
a semiconductor chip;
a heat spreading plate having a stage portion, the semiconductor chip being mounted on the heat spreading plate;
a wiring board supported by the heat spreading plate; and
a sealing resin which seals the semiconductor chip and the heat spreading plate so that the stage portion is exposed from the sealing resin,
wherein the wiring board has a laminate structure.

14. A semiconductor device comprising:
a semiconductor chip;
a heat spreading plate having a stage portion, the semiconductor chip being mounted on the heat spreading plate;
a wiring board supported by the heat spreading plate; and
a sealing resin which seals the semiconductor chip and so that the stage portion is exposed from the sealing resin,
wherein the heat spreading plate has an anchor portion to be waged into the wiring board.

15. A semiconductor device comprising:
a semiconductor chip;
a heat spreading plate having a stage portion, the semiconductor chip being mounted on the heat spreading plate;

a wiring board supported by the heat spreading plate; and a sealing resin which seals the semiconductor chip and the heat spreading plate so that the stage portion is exposed from the sealing resin, the wiring board includes a first wiring layer formed on a packaging side surface of the wiring board, and an opening portion through which the semiconductor chip is mounted; and the first wiring layer includes an outer portion having external connecting terminals, and an inner portion having wires electrically connected to the semiconductor chip, wherein the heat spreading plate has an engaging portion for engaging the heat spreading plate with a rim of the opening portion.

16. A semiconductor device comprising:

a semiconductor chip;

a heat spreading plate having a stage portion, the semiconductor chip being mounted on the heat spreading plate;

a wiring board supported by the heat spreading plate; and a sealing resin which seals the semiconductor chip and the heat spreading plate so that the stage portion is exposed from the sealing resin, the wiring board includes a first wiring layer formed on a packaging side surface of the wiring board, and an opening portion through which the semiconductor chip is mounted; and the first wiring layer includes an outer portion having external connecting terminals, and an inner portion having wires electrically connected to the semiconductor chip, wherein the heat spreading plate is disposed in a position opposite to a bonding position of the wires to the wiring board.

17. The semiconductor device according to claim 3, wherein the connecting portions extend outward from the rim of the opening portion formed in the wiring board.

18. A semiconductor device comprising:

a semiconductor chip;

a heat spreading plate having a stage portion, the semiconductor chip being mounted on the heat spreading plate;

a wiring board supported by the heat spreading plate; and a sealing resin which seals the semiconductor chip and the heat spreading plate so that the stage portion is exposed from the sealing resin, wherein a thin portion is formed on an outer periphery of the heat spreading plate.

19. A semiconductor device comprising:

a semiconductor chip;

a heat spreading plate having a stage portion, the semiconductor chip being mounted on the heat spreading plate;

a wiring board supported by the heat spreading plate; and a sealing resin which seals the semiconductor chip and the heat spreading plate so that the stage portion is exposed from the sealing resin wherein a thin portion is formed on an outer periphery of the wiring board.

20. A semiconductor device comprising:

a semiconductor chip;

a heat spreading plate having a stage portion, the semiconductor chip being mounted on the heat spreading plate;

a wiring board supported by the heat spreading plate; and a sealing resin which seals the semiconductor chip and the heat spreading plate so that the stage portion is exposed from the sealing resin, wherein the stage portion is provided with a vent hole for releasing vapor existing inside the semiconductor device upon packaging.

21. The semiconductor device according to claim 20, wherein the stage portion is provided with a tape member for blocking the vent hole on a semiconductor chip mounting side.

22. The semiconductor device according to claim 20, wherein the stage portion is provided with a tape member for blocking the vent hole on an opposite side to a semiconductor chip mounting side.

23. A semiconductor device comprising:

a semiconductor chip;

a heat spreading plate having a stage portion, the semiconductor chip being mounted on the heat spreading plate;

a wiring board supported by the heat spreading plate; and a sealing resin which seals the semiconductor chip and the heat spreading plate so that the stage portion is exposed from the sealing resin, wherein the stage portion has a plating portion having corrosion resistance on an exposed region of the stage portion from the sealing resin.

24. The semiconductor device according to claim 4, wherein the wiring board has solder balls as external connecting terminals, and the first sealing resin portion has a protruding portion protruding from the wiring board.

* * * * *